(12) United States Patent
Zhang et al.

(10) Patent No.: US 12,310,146 B2
(45) Date of Patent: May 20, 2025

(54) METHODS FOR DIE-TO-WAFER DEVICE LAYER TRANSFER WITH PRECISE CONTROL OF DEVICE LAYER VERTICAL POSITION

(71) Applicant: Apple Inc., Cupertino, CA (US)

(72) Inventors: Lei Zhang, Albuquerque, NM (US); Fang Ou, San Jose, CA (US); Lina He, San Jose, CA (US); Paul S. Drzaic, Morgan Hill, CA (US); Dmitry S. Sizov, Cupertino, CA (US); Ranojoy Bose, Fremont, CA (US); Yuewei Zhang, Santa Barbara, CA (US); Xiaobin Xin, Sunnyvale, CA (US); Nathaniel T. Lawrence, San Francisco, CA (US); Wei H. Yao, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 464 days.

(21) Appl. No.: 17/649,018

(22) Filed: Jan. 26, 2022

(65) Prior Publication Data
US 2022/0285577 A1  Sep. 8, 2022

Related U.S. Application Data

(60) Provisional application No. 63/156,140, filed on Mar. 3, 2021.

(51) Int. Cl.
*H01L 33/00* (2010.01)
*H01L 25/16* (2023.01)
*H10H 20/01* (2025.01)

(52) U.S. Cl.
CPC ......... *H10H 20/018* (2025.01); *H01L 25/167* (2013.01)

(58) Field of Classification Search
None
See application file for complete search history.

(56) References Cited

U.S. PATENT DOCUMENTS

2013/0020597 A1* 1/2013 Horng ............... H01L 33/22
257/98
2013/0023073 A1* 1/2013 Horng ............... H01L 33/0093
257/E33.068
2022/0357607 A1* 11/2022 Song .................... G02F 1/13392

FOREIGN PATENT DOCUMENTS

WO  2019147589 A1  8/2019

* cited by examiner

*Primary Examiner* — Robert K Carpenter
(74) *Attorney, Agent, or Firm* — Aikin & Gallant, LLP

(57) ABSTRACT

Methods and structures are described to facilitate the transfer of device layer coupons with controlled vertical position. In an embodiment, a plurality of device layer coupons is bonded to a receiving substrate with an adhesive layer, where distance between front surfaces of the plurality of device layer coupons and a bulk layer of the receiving substrate is controlled by a plurality of rigid mechanical spacers.

13 Claims, 17 Drawing Sheets

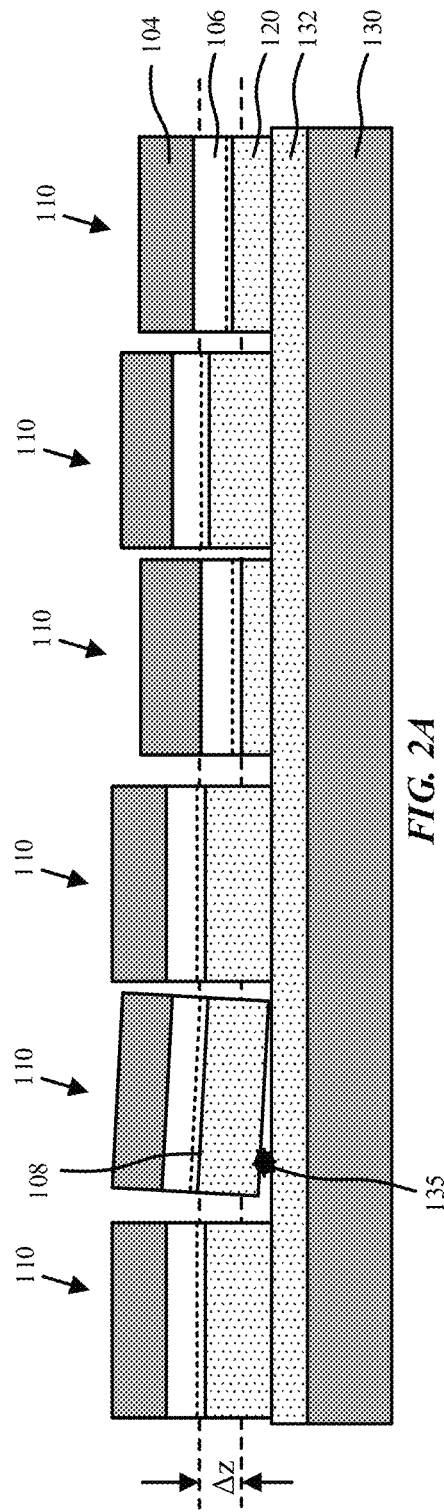
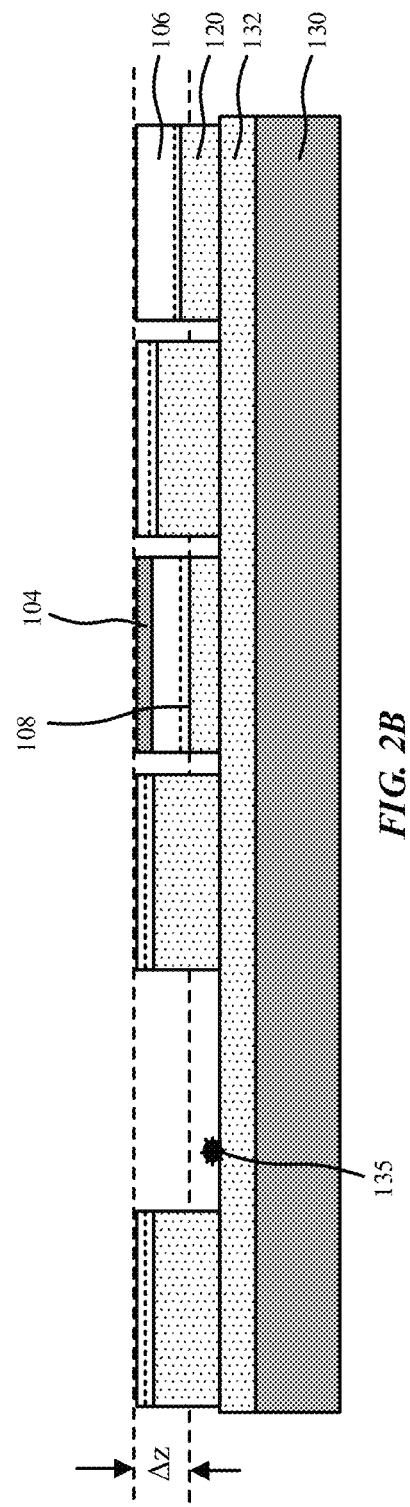
FIG. 2A
FIG. 2B

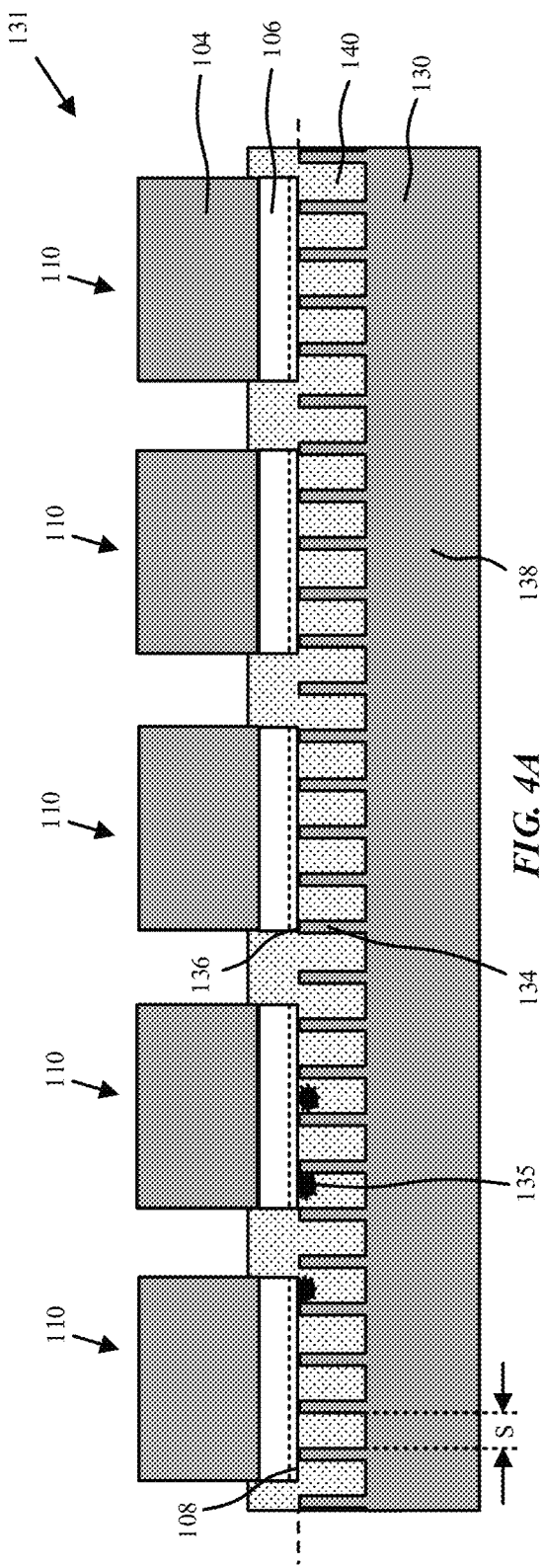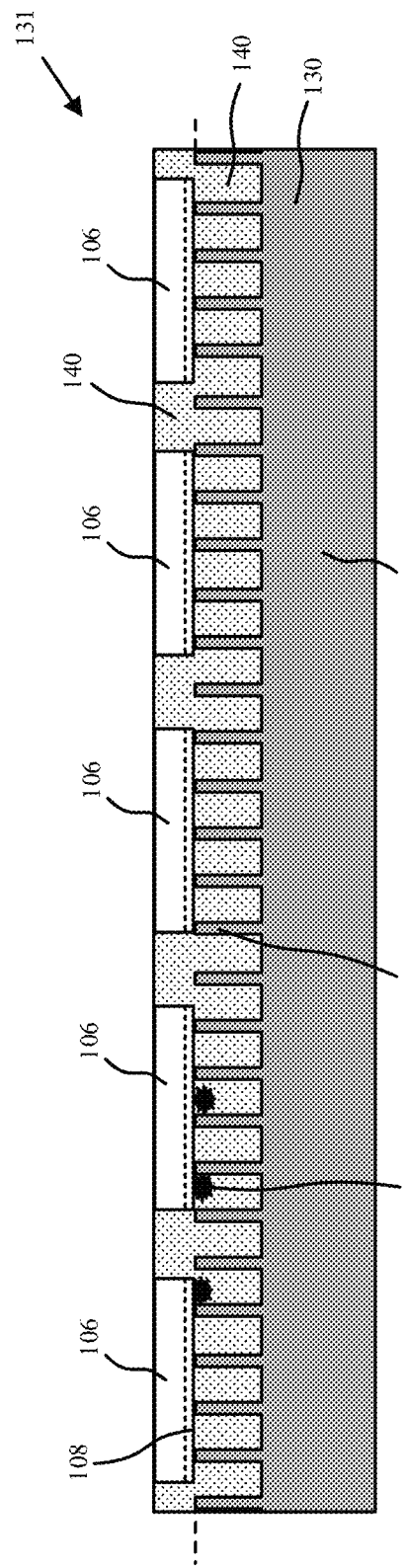

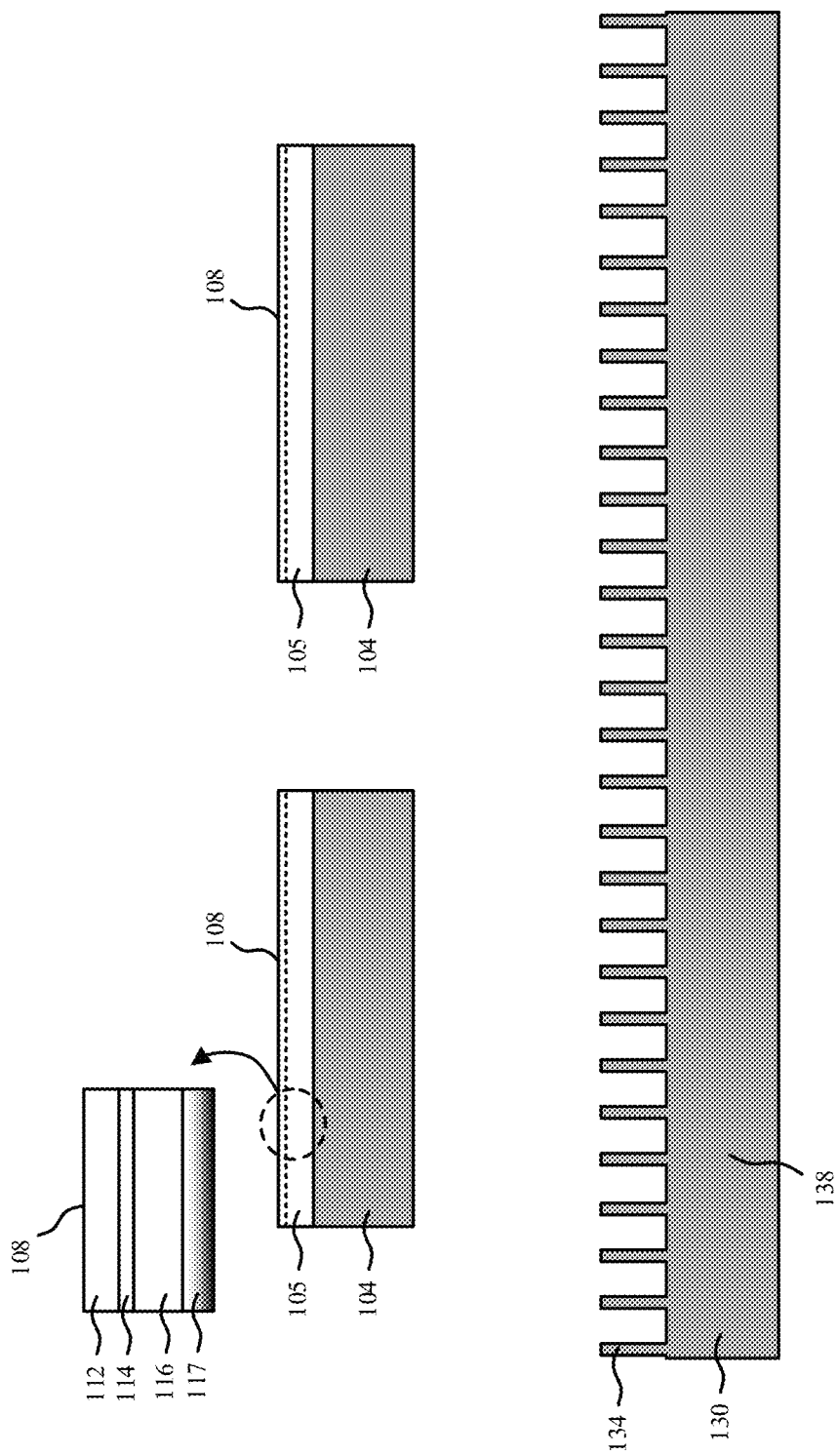

METHODS FOR DIE-TO-WAFER DEVICE LAYER TRANSFER WITH PRECISE CONTROL OF DEVICE LAYER VERTICAL POSITION

RELATED APPLICATIONS

This application claims the benefit of priority of U.S. Provisional Application No. 63/156,140 filed Mar. 3, 2021, which is incorporated herein by reference.

BACKGROUND

Field

Embodiments described herein relate to die-to-wafer transfer, and more particularly layer transfer of epitaxial device layers.

Background Information

Wafer-to-wafer (W2W) and die-to-wafer (D2W) are well established microelectronic fabrication techniques that commonly use $SiO_2$—$SiO_2$ fusion bonding between wafers or chips on wafer. This may additionally be combined with metal-metal bonding for hybrid bonding techniques. Hybrid bonding is a suitable technology that has been adopted in mass production for high density input/output (I/O) chips with ultra-small pad pitches. Generally, a hybrid bonding process flow may include an initial oxide to oxide bond at room temperature, followed by heating to close dishing gap, and then further heating to compress metal.

Typically, when using hybrid bonding for heterogenous integration of dissimilar materials, the two bonded substrates should have similar coefficients of thermal expansion (CTE). For substrates with dissimilar CTE, the bonding may be damaged between the heating and cooling processes due to strain between the substrates, resulting in delamination or other damage. The hybrid bonding processes must also have stringent pre-bonding cleaning protocols to avoid the presence of particles at the bonding interfaces.

SUMMARY

Methods and structures are described to control vertical position of device layer coupons during device layer transfer. In particular, the fabrication sequences may be utilized for the fabrication of micro light emitting diode (LED) display panels. In an embodiment, the fabrication sequences include the formation of reconstituted structure of a plurality of device layer coupons, followed by bonding the reconstituted structure to a receiving substrate to transfer the plurality of device layer coupons to the receiving substrate. More specifically, the method of forming the reconstituted structure can include bonding a plurality of device layer coupons on the carrier substrate with an adhesive layer. The plurality of device layer coupons may be diced from multiple different handle (e.g. growth) substrates. In such a process, the plurality of rigid mechanical spacers can function to control a distance between front surfaces of the plurality of device layer coupons and a bulk layer of the carrier substrate. The plurality of rigid mechanical spacers can function to control vertical position, while also accommodating the presence of potential particles at the bonding interface without affecting vertical position of the device layer coupons.

BRIEF DESCRIPTION OF THE DRAWINGS

FIG. 2A is a schematic cross-sectional side view illustration of a reconstituted structure including plurality of device layer coupons fusion bonded to a carrier substrate.

FIG. 2B is a schematic cross-sectional side view illustration of the plurality of device layer coupons of FIG. 2A after handle substrate removal.

FIG. 4A is a schematic cross-sectional side view illustration of a reconstituted structure including plurality of device layer coupons adhesively bonded to a carrier substrate including a plurality of hard stop protrusion structures in accordance with an embodiment.

FIG. 4B is a schematic cross-sectional side view illustration of the plurality of device layer coupons of FIG. 4A after handle substrate removal in accordance with an embodiment.

FIGS. 5A-5D are schematic cross-sectional side view illustrations of a sequence of forming the reconstituted structure of FIG. 4B in accordance with embodiments.

DETAILED DESCRIPTION

Figure 1:
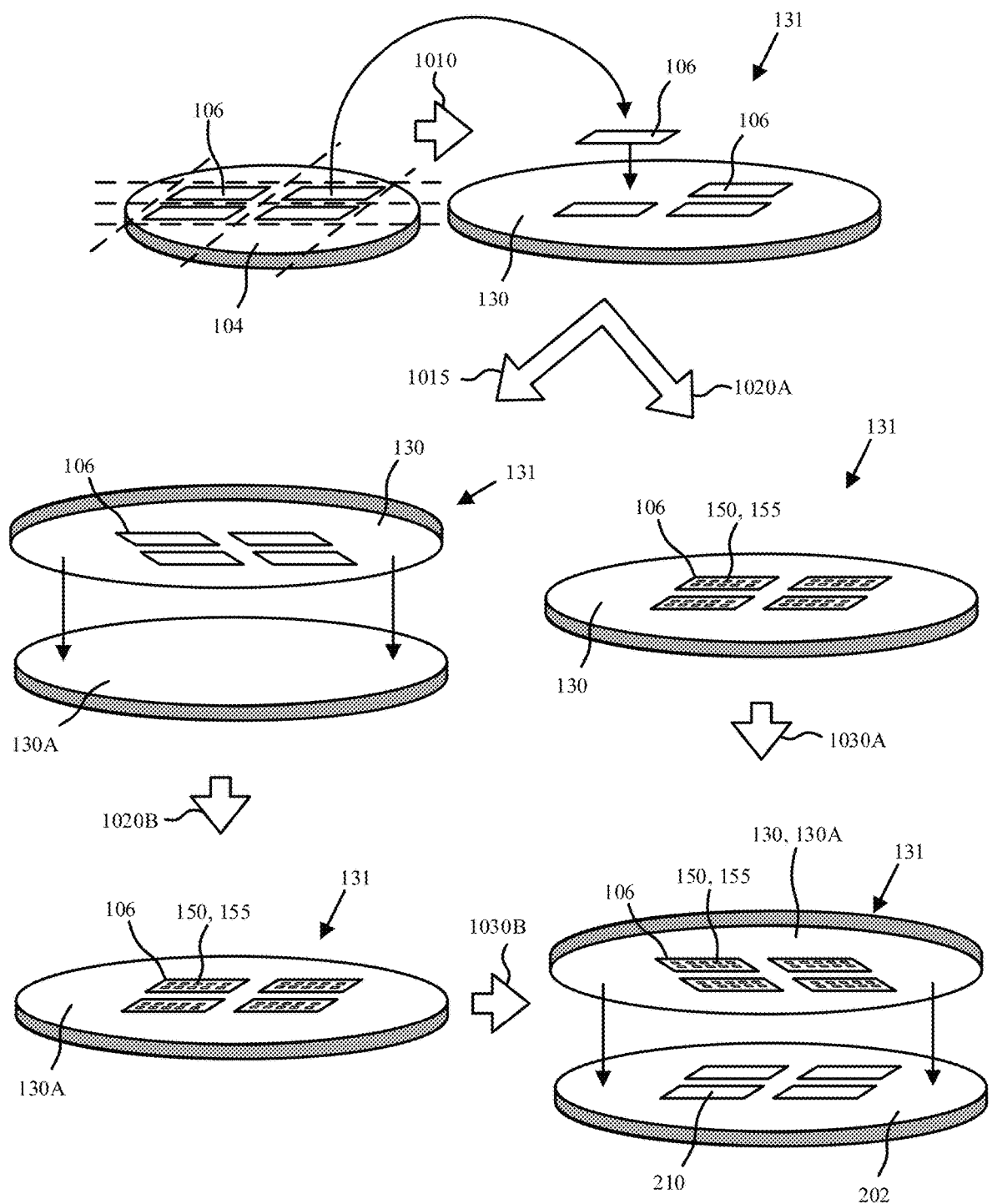
FIG. 1 is a schematic perspective view illustration of a baseline micro LED micro-display fabrication sequence including epi reconstitution, micro LED front plane fabrication, and wafer-to-wafer hybrid integration, in accordance with embodiments.

Embodiments describe methods for die-to-wafer transfer of device layers to control vertical position of the transferred device layers. More specifically, embodiments are described for forming a reconstituted structure including bonding a plurality of device layer coupons on a carrier substrate with an adhesive layer, where a plurality of rigid mechanical spacers control a distance between front surfaces of the plurality of device layer coupons and a bulk layer of the carrier substrate, and the adhesive layer at least partially fills spaces between the plurality of rigid mechanical spacers. This can be followed by bonding of the reconstituted structure to a receiving substrate, and removing the carrier substrate. In such a sequence, the plurality of protrusions can help control vertical position of the device layer coupons, and mitigate the effect of potential particle contamination when forming the reconstituted structure. In an embodiment, the plurality of rigid mechanical spacers is a plurality of hard stop protrusion structures extending from the bulk layer. In an embodiment, the plurality of rigid mechanical spacers is a plurality of microspheres dispersed in the adhesive layer.

After transfer of the device layer coupons to the carrier substrate, the device layer coupons can then optionally be further processed, or even transferred to an intermediate carrier substrate for further processing. For example, where the device layer coupons include p-n diode layers, specific transfer or flipping may be performed so that a preferred side (e.g. p-side or n-side) is face up for processing. In an embodiment, the device layer coupons are further processed to form a plurality of micro light emitting diodes (LEDs) or at least micro LED mesa structures of partially fabricated micro LEDs. The reconstituted structure can then in turn be bonded to a receiving substrate such as a carrier substrate to again transfer the plurality of device layer coupons.

The device layer coupons in accordance with embodiments may be any device layer for heterogenous integration, and may include an epitaxial layer such as, but not limited to, as an as-grown light emitting diode (LED) epitaxial layer, a laser diode (LD) epitaxial layer, a photodiode (PD) epitaxial layer, a vertical cavity surface emitting laser (VCSEL) epitaxial layer, a micro-electrical mechanical systems (MEMS) epitaxial layer, an InGaN/GaN based blue/green/red LED epitaxial layer, an AlInGaP/GaAs based red/orange/yellow LED epitaxial layer, or an organic LED layer.

The device layers can additionally include a conductive layer on top, such as indium tin oxide (ITO) or other transparent conductive oxide layer, or a metal layer. Additionally, a dielectric layer may be formed over the conductive layer. For example, the dielectric layer may be a $SiO_2$ layer, an $AlO_x$ layer, a $SiN_x$ layer, or a SiC layer. In some embodiments, the device layer may include functional devices, formed by patterning the epitaxial device layer and forming electrical connections.

In accordance with embodiments, the fabrication sequence described herein may be utilized in the formation of a display panel, or more specifically a micro LED based display panel for micro-display. Fabrication of micro LED-array based micro-display panels in accordance with embodiments may include hybrid integration of a micro LED array front plane (e.g. wafer, or device layer coupon) to a complementary metal oxide semiconductor (CMOS) driver backplane. Usually, sophisticated designs of high pixel density driver back plane require CMOS technology nodes only available on a 12 inch silicon platform. In addition, 12 inch silicon CMOS backplanes are preferred from cost and throughput considerations. However, the LED epitaxial structures for efficient blue/green/red emission may be grown on substrate wafers with the size of 8 inch or less. Furthermore, direct growth of epitaxial LED layers on 12 inch silicon substrate wafers still remains at an early stage of development and may take considerable time to mature. In accordance with embodiment, epitaxial device layer reconstitution provides an alternative approach to create artificial 12 inch epi-on-silicon wafers from commercially available smaller size epitaxial wafers. In the epitaxial layer reconstitution processes described herein, smaller size epitaxial wafers may be diced into individual coupon stacks which are then bonded face down onto 12 inch silicon carrier wafers. Once the growth (e.g. handle) substrates of the epi-coupons are removed, artificial 12 inch epi-on-silicon wafers are created for the subsequent micro LED front plane processes and 12 inch wafer-to-wafer hybrid integration.

Among various available bonding techniques, fusion bonding and adhesive bonding are two widely used techniques for wafer bonding. It has been observed that for fusion bonding where the bonding layers on both epitaxial coupons and receiving 12 inch silicon substrate are a rigid material such as $SiO_2$, the presence of particles on the bonding surface can cause detrimental effects. To avoid bonding failure due to presence of particles or debris on the bonding surfaces, an alternative approach is using adhesive polymers, either in liquid or soft cured form, as bonding agents. However, it has been observed that since the epitaxial coupons populating a 12 inch silicon wafer are from multiple epitaxial wafers, the thickness of epi coupons can vary due to growth substrate thickness variation and epitaxial layer thickness variation. As a result, such thickness variation in conjunction with the soft bonding layer has been observed to cause poor vertical position control and tilt of the transferred epitaxial coupons, which makes the subsequent micro LED array processes very challenging and deteriorates the performance and uniformity of the micro LED arrays. To address this issue, embodiments implement a structural hard stop mechanism so that the transferred epitaxial coupons are pressed against these hard stop features and therefore can mitigate the uncertainty of the vertical position and tilt of the transferred epitaxial coupons.

It is to be appreciated that while the specific recitation of 6 inch, 8 inch, 12 inch, and 450 mm wafers, etc. is made herein, that these are representations of present industry standards which can vary. Accordingly, embodiments are not limited to the specific wafer or substrate sizes described in the exemplary descriptions.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment.

Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 an illustration is provided of a baseline reconstituted structure 131 and fusion bonding sequence in accordance with embodiments. As shown, the sequence may begin with a plurality of device layer coupons 106 on handle substrate 104. For example, the device layer coupons 106 may be patterned epitaxial device layers, or areas that will instead be subsequently diced (as shown by the dashed lines). The handle substrate 104 may optionally be a growth substrate such as silicon, sapphire, GaN, GaAs, etc. depending upon composition of the device layer coupons 106. As such the device layer coupons 106 may be a uniform device layer, where the growth substrate and device layer will be subsequently diced to form coupon stacks including the device layer coupons 106. Alternatively, the handle substrate may be a support substrate to which a device layer has been transferred, for example from a growth substrate. In this configuration the support substrate and device layer can be subsequently diced to form coupon stacks including the device layer coupons 106. Either sequence is possible depending upon which side of the device layer is to be processed.

The device layer coupons can additionally include a conductive layer on top, such as indium tin oxide (ITO) or other transparent conductive oxide layer, or a metal layer. Additionally, a dielectric layer may optionally be formed over the conductive layer. For example, the dielectric layer may be a $SiO_2$ layer, an $AlO_x$ layer, a $SiN_x$ layer, or a SiC layer. In some embodiments, the device layer may include functional devices, formed by patterning the epitaxial device layer and forming electrical connections.

The plurality of device layer coupons 106 can then be transferred to a carrier substrate 130 to form a reconstituted structure 131 at operation 1010. For example, such a transfer can include D2W of individual device layer coupons 106 (or coupon stacks) or W2W bonding. Either such technique can use techniques such as fusion bonding, hybrid bonding, adhesive bonding, etc. As will be described in further detail herein the plurality of device layer coupons 106 (or coupon stacks) may be adhesively bonded on top of a plurality of rigid mechanical spacers. For example, these may be a plurality of hard stop protrusion structures extending from a bulk layer of the carrier substrate, or a plurality of microspheres dispersed in an adhesive layer.

The carrier substrate 130 may be a variety of materials such as silicon wafer, glass substrate, sapphire wafer, or any flat wafer made of materials with a coefficient of thermal expansion (CTE) range from $1-20 \times 10^{-6}$/K, for example. Size of the carrier substrate may be 6 inch, 8 inch, 12 inch, or 450 mm, for example. In an embodiment, size of a maximum lateral dimension for the semiconductor device layer coupons nominally ranges from 100 µm to 10 cm, or more specifically 500 µm to 10 cm.

At this stage the reconstituted structure 131 can be directed to several different processing sequences. In an embodiment of a first processing sequence illustrated in FIG. 1, the reconstituted structure 131 can then be further processed at operation 1020A, for example to form arrays of micro LEDs 150, or at least micro LED mesa structures 155 of partially fabricated micro LEDs 150 in the device layer coupons 106. For example, each micro LED mesa structure 155 may have a maximum lateral dimension of 1-100 µm, such as 1-10 µm, or possibly even smaller than 1 µm. A receiving substrate 202 can then be provided including circuitry 210, such as driver circuitry. In accordance with embodiments, receiving substrate 202 may be a silicon substrate for example, to support CMOS driver circuitry. The reconstituted structure 131 can then be bonded to the receiving substrate 202 at operation 1030A. Specifically, the arrays of micro LED mesa structures 155 of the device layer coupons 106 can be bonded to driver pads, and any other pad connections of the circuitry 210. This may include W2W bonding including fusion bonding, or hybrid bonding. In this manner hybrid bonding can include bother metal-metal bonds for micro LED 150 pads to driver pads, and oxide-oxide bonds of planarized insulating layers (e.g. $SiO_2$). This may be followed by removing the carrier substrate 130, leaving the plurality of device layer coupons 106 on the receiving substrate 202. This may be followed by further wafer level processing including chemical mechanical polishing (CMP), redistribution layer (RDL) and/or optical structure formation, such as color filter array, micro lens array, etc.

In an alternative second processing sequence, the resultant reconstituted structure 131 of operation 1010 can then be bonded to a second carrier substrate 130A. For example, this may include a fusion bonding process (e.g. $SiO_2$—$SiO_2$ bonding interface). The carrier substrate 130 can then be removed leaving the device layer coupons 106 on the second carrier substrate 130A. As a result, orientation of the device layer coupons 106 is now flipped. The resultant reconstituted structure 131 can then be further processed at operation 1020B similarly as previously described at operation 1020A to form arrays of micro LEDs 150, or at least micro LED mesa structures 155 of partially fabricated micro LEDs 150 in the device layer coupons 106. The reconstituted structure 131 can then be bonded to the receiving substrate 202 at operation 1030B similarly as previously described with regard to operation 1030A.

As will become more apparent in the following description two significant differences exist in the two process flows. Firstly, the orientation of the device layer coupons 106 can be flipped with the extra W2W operation. Secondly, processing of the device layer coupons 106 to form arrays of micro LEDs 150 or micro LED mesa structures 155 can be formed on different carrier substrates. For example, the device layer coupons 106 may be bonded to the carrier substrate 130 with an adhesive bonding material and rigid mechanical spacers, while device layer coupons 106 may be bonded to the second carrier substrate 130A with fusion bonding. Additionally, the fusion bonded reconstituted structure 131 including the second carrier substrate 130A may be potentially be exposed to higher processing temperature conditions without inclusion of the adhesive bonding material used for initial transfer of the device layer coupons 106 to the carrier substrate 130 and initial control of vertical position.

Referring now to FIG. 2A-2B, FIG. 2A is a schematic cross-sectional side view illustration of a plurality of device layer coupons 106 fusion bonded to a carrier substrate 130, FIG. 2B is a schematic cross-sectional side view illustration of the plurality of device layer coupons 106 of FIG. 2A after handle (e.g. growth) substrate 104 removal. In particular, FIGS. 2A-2B illustrate the potential impact of particles on fusion bonding, and consequentially hybrid bonding techniques. For fusion bonding where the bonding layers on both epitaxial device layer coupons and the carrier substrate 130 (e.g. 12 inch silicon) are rigid material such as SiO$_2$, the presence of particles 135 on the bonding surface can cause detrimental effects. In addition, since the epitaxial device layer coupons 106 populating a 12 inch silicon wafer are from multiple handle substrates 104, the bonding layer thickness variation can dictate the vertical position variation of the epitaxial device layer coupons 106 transferred onto a larger carrier substrate 130. The vertical position variation ($\Delta z$) of a front surface 108 of the device layer coupons 106 across an exemplary 12 inch carrier substrate 130 could be as large as approximately 500 nm, which can make the subsequent micro LED array fabrication processes challenging and deteriorate the performance and uniformity of the micro LED arrays.

Referring again to FIG. 2A an exemplary processing sequence is illustrated in which a one or more dielectric layers 120 (e.g. SiO$_2$) is deposited over the plurality of device layer coupons 106 on handle substrate 104, which is then diced into a plurality of coupon stacks 110. It has been observed that dicing of the coupon stacks 110 can generated particles 135. When bonded to a corresponding dielectric layer 132 on the carrier substrate 130 the particles can affect the bonding interface. Furthermore, where coupon stacks 110 are transferred from different handle substrates 104, or from different areas of a same handle substrate 104, there may be process variations on layer thickness, in particular of the dielectric layers 120 that may also contribute to the vertical position variation ($\Delta z$). This is further illustrated in FIG. 2B after removal of the handle substrate 104 portions, for example using known techniques such as grinding, laser lift-off, etc. Presence of particles 135 may additionally cause delamination of the device layer coupons 106. Furthermore, the vertical position variation ($\Delta z$) can also contribute to the result of irregular thicknesses of the device layer coupons 106, or incomplete removal of the handle substrate 104, further leading to end product performance variations.

Figure 3A:
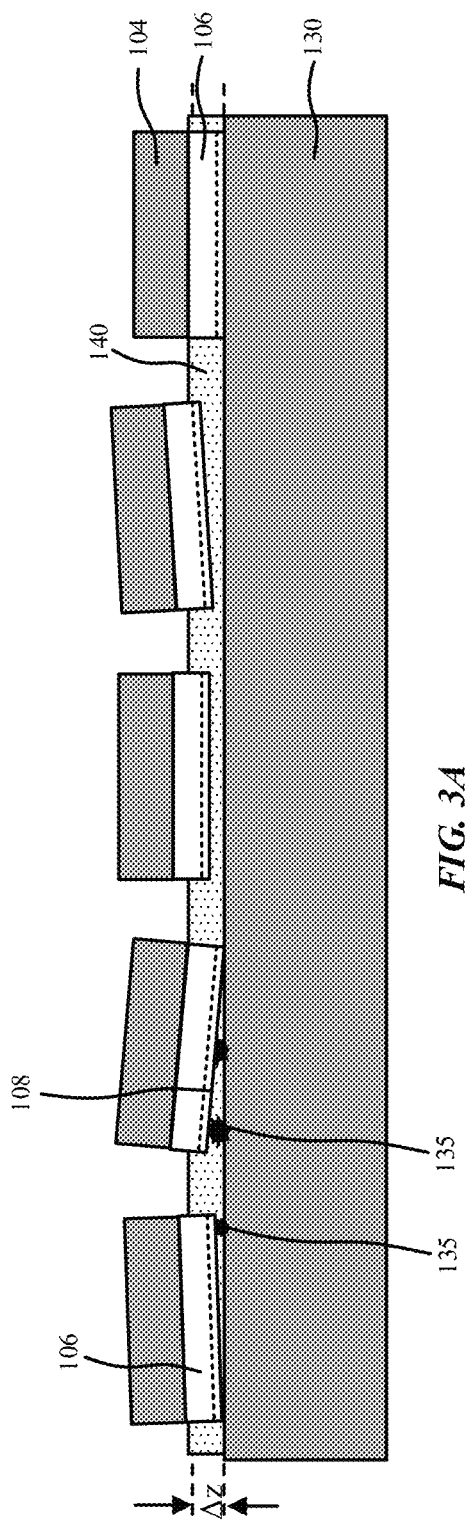
FIG. 3A is a schematic cross-sectional side view illustration of a reconstituted structure including plurality of device layer coupons adhesively bonded to a carrier substrate.
Figure 3B:
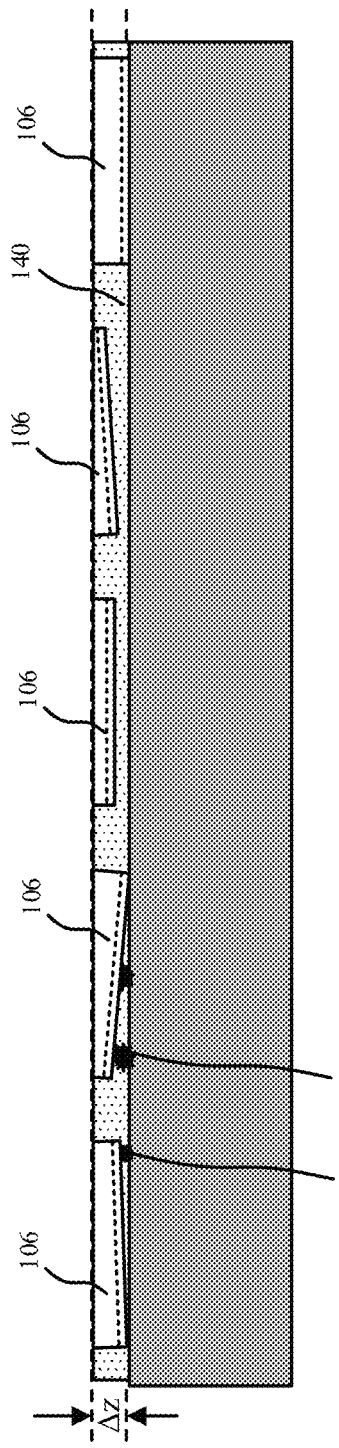
FIG. 3B is a schematic cross-sectional side view illustration of the plurality of device layer coupons of FIG. 3A after handle substrate removal and planarization.

Referring now to FIG. 3A-3B, FIG. 3A is a schematic cross-sectional side view illustration of a plurality of device layer coupons 106 adhesively bonded to a carrier substrate 130, FIG. 3B is a schematic cross-sectional side view illustration of the plurality of device layer coupons 106 of FIG. 3A after handle (e.g. growth) substrate 104 removal. In particular, FIGS. 3A-3B illustrate the potential impact of particles on adhesive bonding, and consequentially hybrid bonding techniques.

To avoid bonding failure due to presence of particles or debris on the bonding surfaces, an alternative approach is using adhesive polymers, either in liquid or soft cured form, as bonding agents. However, since the device layer coupons 106 populating an exemplary 12 inch carrier substrate 130 may be from multiple handle substrates 104, the thickness of coupon stacks 110 can vary due to handle (growth) substrate 104 thickness variation and epitaxial device layer coupon 106 thickness variation. Such thickness variation in conjunction with the soft bonding layer can cause poor vertical position control and tilt of the transferred device layer coupons 106. Referring to FIG. 3B the vertical position variation ($\Delta z$) can also contribute to the result of irregular thicknesses of the device layer coupons 106, or incomplete removal of the handle substrate 104, further leading to end product variations.

Referring now to FIGS. 4A-4B, FIG. 4A is a schematic cross-sectional side view illustration of a reconstituted structure 131 including plurality of device layer coupons 106 adhesively bonded to a carrier substrate 130 including a plurality of hard stop protrusion structures 134 in accordance with an embodiment, FIG. 4B is a schematic cross-sectional side view illustration of the plurality of device layer coupons 106 of FIG. 4A after handle (e.g. growth) substrate 104 removal in accordance with an embodiment.

In one aspect, the hard stop protrusion structures 134 in accordance with embodiments are implemented to address the resultant vertical position variations ($\Delta z$) and tilt that can occur with the fusion or hybrid bonding techniques of FIGS. 2A-2B and adhesive bonding techniques of FIGS. 3A-3B. Specifically, in order to achieve more particle tolerance, better vertical position control, and better parallel-ness control of transferred device layer coupons 106 onto an exemplary 12 inch carrier substrate 130 isolated hard stop protrusion structures 134 are formed on or from the carrier substrate 130 using a suitable technique such as (1) photolithography patterning and etching of exposed bulk layer 138 (e.g. silicon); (2) nano-imprint lithography followed by dry/wet etching method; (3) forming a uniform layer, e.g. a polymer layer, a metal layer, or a dielectric layer, on top of the bulk layer 138, followed by patterning and etching the layer using photolithography or nano-imprint lithography and dry/wet etching method; (4) forming a uniform layer of photo-sensitive polymer, e.g. polyimide, benzocyclobutene (BCB), photoresist, or SU-8, on top of the bulk layer 138, followed by patterning the layer using photolithography or embossing/imprinting method; or (5) attaching a pre-patterned protrusion structure layer onto the bulk layer 138. As shown, the hard stop protrusion structures 134 can extend from a bulk layer 138 of the carrier substrate 130, and may be integrally formed with the bulk layer 138, or as a separate layer on top of the bulk layer 138.

Forming a hard stop protrusion structures 134 on top of the carrier substrate 130 may further include chemical mechanical polishing the hard stop protrusion structures 134 to planarize the top surfaces 136 of the protrusion structures across the entire carrier substrate 130. For example, the plane defined by the top surfaces 136 may be substantially flat, with the unevenness less than 200 nm. The hard stop protrusion structures 134 can assume a variety of shapes when viewed from the top surfaces 136, such as circle, square, rectangle, triangle, hexagon, star, a mesh network pattern, and other arbitrary shapes. The arrangement of hard stop protrusion structures 134 can be a uniform array pattern, or non-uniform array pattern, e.g. less densely arranged in the areas that has higher particle density. The sidewalls of the hard stop protrusion structures 134 can be vertical or slanted. In various embodiments, horizontal dimension of the hard stop protrusion structures (e.g. width) nominally ranges from 1 um to 100 μm, and height of the hard stop protrusion structures nominally ranges from 200 nm to 10 μm. Average spacing between adjacent hard stop protrusion structures may nominally be 2 to 10 times of the horizontal dimension of the hard stop protrusion structures, and may be substantially smaller, such as half or less, than the dimensions of the device layer coupons 106.

As shown in FIG. 4A an adhesive layer 140 can be dispensed on top of the carrier substrate 130 with hard stop protrusion structures 134. The adhesive layer may cover the top surfaces 136 of the hard stop protrusion structures and fill the spaces (S) therebetween. Forming the adhesive layer 140 in accordance with embodiments may include (1) forming a continuous adhesive layer 140 covering the entire surface of the carrier substrate 130; (2) forming a patterned adhesive layer with gaps or voids existing periodically to facilitate the lateral expansion of adhesive when pressed during adhesive hardening process, (3) forming a patterned adhesive layer covering the surface of the carrier substrate 130 except in the vicinity of the hard stop protrusion structures so that the hard stop protrusion structures are isolated from the adhesive layers. The adhesive layer can also be formed on the front surface 108 of the device layer coupons 106, the adhesive layer may be continuous layer or a patterned layer with recessed area that the locations of the recessed area match the hard stop protrusion structures 134 on the carrier substrate 130. The adhesive layer 140 may be a benzocyclobune (BCB) layer, a polyimide layer, a SU-8 layer, an acrylic layer, or a silicone layer, or combination of the above.

In other embodiments the adhesive layer 140 may be a colloidal adhesive layer that provides the rigid mechanical spacer control, and may be applied without the hard stop protrusion structures 134. For example, as will be described in further detail with regard to FIG. 6 the adhesive layer 140 may also be a colloidal adhesive layer with rigid microspheres suspended in the adhesive, the diameters (d) of the microsphere are substantially the same, preferentially with $\Delta d<100$ nm.

Figure 6:
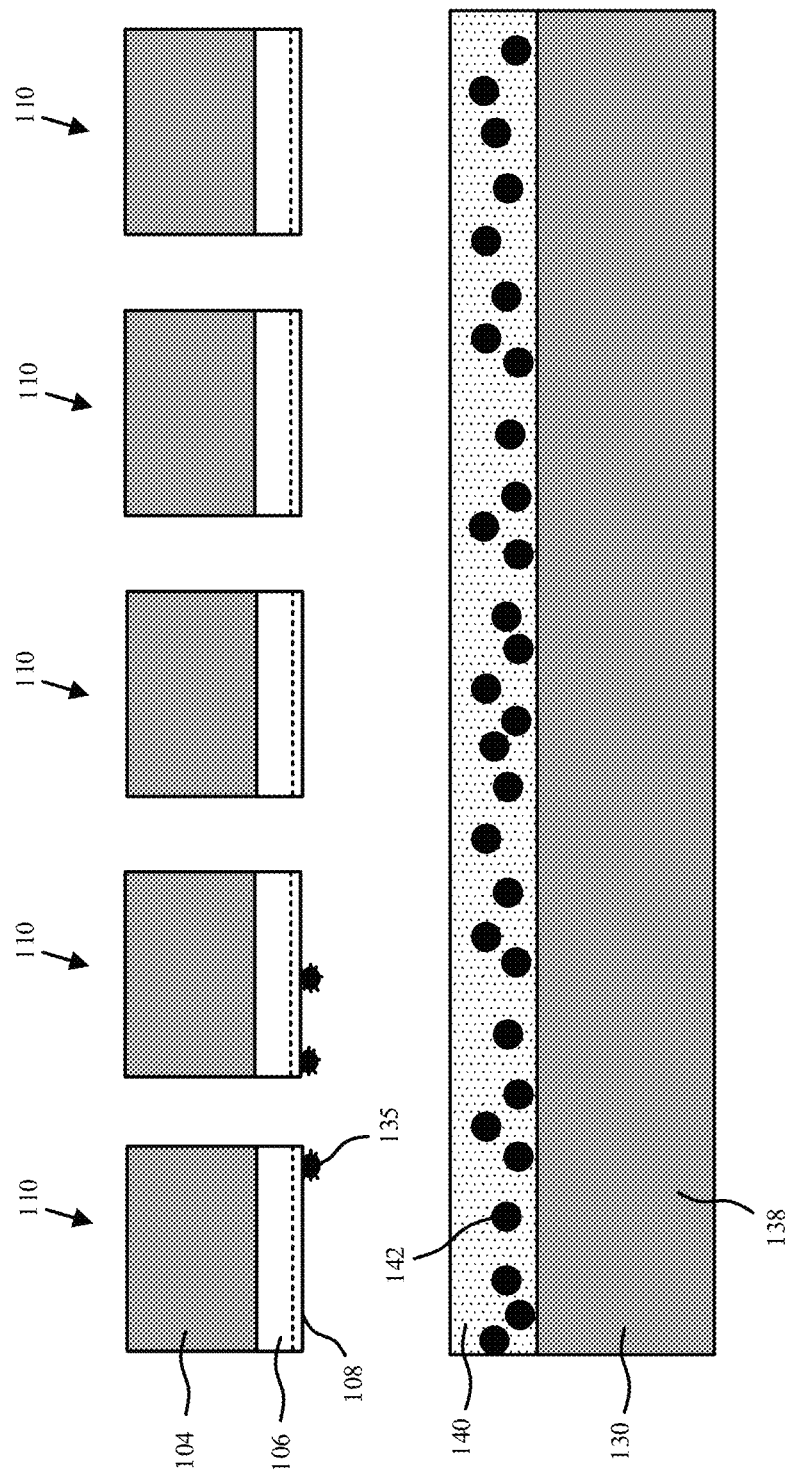
FIG. 6 is a schematic cross-sectional side view illustration of a bonding operation including a colloidal adhesive layer in accordance with embodiments.

The coupon stacks 110 can be transferred to the carrier substrate 130 firmly pressing against the rigid mechanical spacers, which may be the hard stop protrusion structures 134 as shown in FIG. 4A, or alternatively the rigid microspheres of FIG. 6. The adhesive layer 140 may additionally be cured and hardened by heating up to elevated temperatures or by irradiation (laser, UV, e-beam, etc), while forces press the device layer coupons 106 firmly against the hard stop protrusion structures. In this manner, the front surfaces 108 of device layer coupons 106 will be well aligned to the plane defined by the top surfaces 136 of the hard stop protrusion structures 134, thus achieving precise control of the vertical position and parallel-ness of the device layer coupons 106 transferred to the exemplary 12 inch carrier substrate. The handle substrate 104 portions can then be removed, for example using known techniques such as grinding, laser lift-off, etc. without affecting the location of the device layer coupons 106. In an embodiment, the resultant reconstituted structure 121 includes a vertical position variation ($\Delta z$) of front surfaces 108 of less than 50 nm.

Figure 4C:
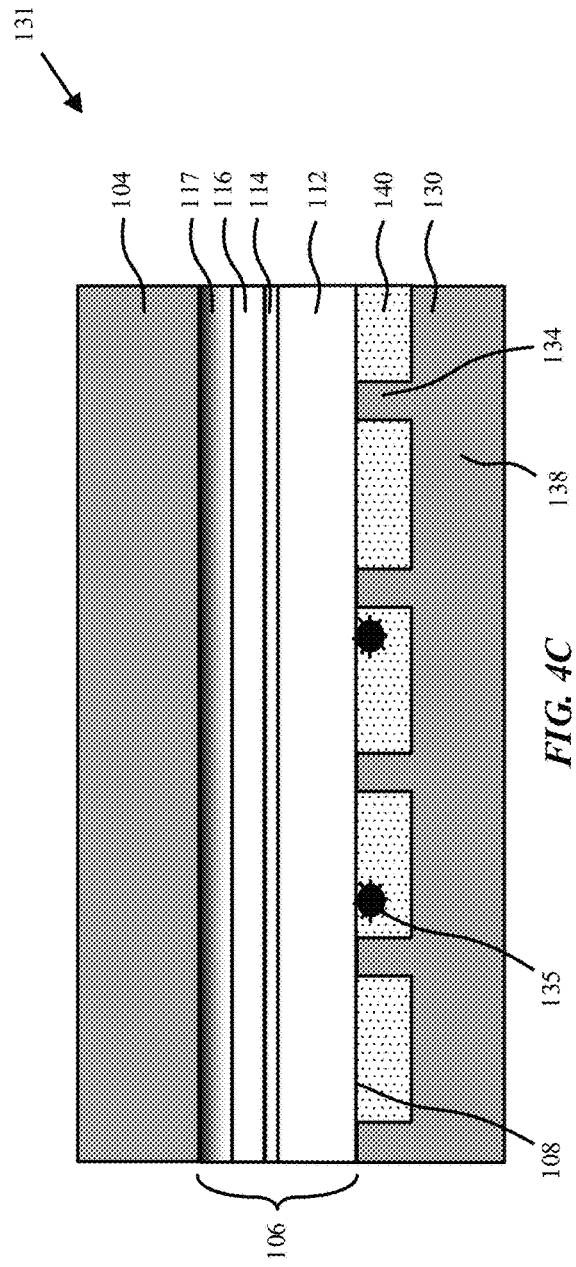
FIG. 4C is a close-up schematic cross-sectional side view illustration of an epitaxial device layer coupon adhesively bonded to a carrier substrate including a plurality of hard stop protrusion structures in accordance with an embodiment.
Figure 4D:
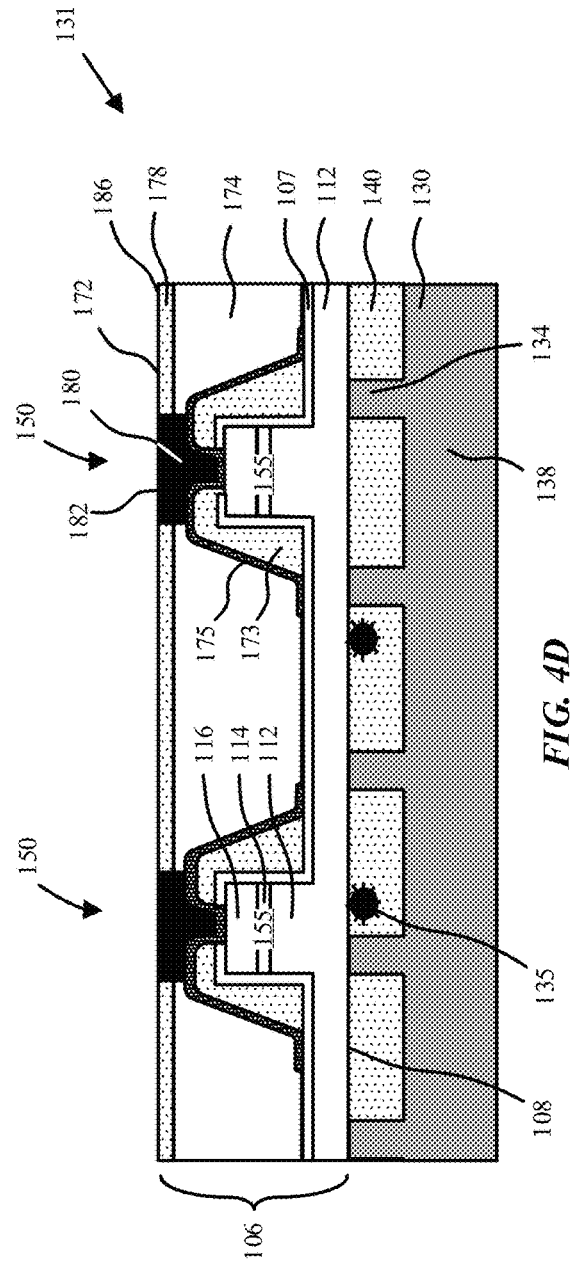
FIG. 4D is a close up schematic cross-sectional side view illustration of a plurality of micro LEDs formed in an epitaxial device layer coupon of FIG. 4A after handle substrate removal in accordance with an embodiment.

Referring now to FIGS. 4C-4D, FIG. 4C is a close-up schematic cross-sectional side view illustration of an epitaxial device layer coupon 106 adhesively bonded to a carrier substrate 130 including a plurality of hard stop protrusion structures 134 in accordance with an embodiment, FIG. 4D is a schematic cross-sectional side view illustration of the plurality of micro LEDs 150 formed in the epitaxial device layer coupons 106 of FIG. 4A after handle (e.g. growth) substrate 104 removal in accordance with an embodiment and the subsequent processing operation 1020A of FIG. 1. In particular, FIGS. 4C-4D illustrate a reconstituted structure 131 that can be used in the fabrication of micro LED array based micro-displays. While the specific process is illustrated with regard to hard stop protrusion structures 134, the rigid microspheres of FIG. 6 may alternatively be used.

In the structure illustrated in FIG. 4C the coupon stacks have already been transferred and bonded to the carrier substrate 130. Similar to previous descriptions the coupon stacks include portions of the handle substrate 104 and device layer coupon 106. The devices layer coupons 106 could have been previously transferred to the handle substrate 104, or grown directly on the handle substrate. In such a configuration, the device layer coupons 106 can include a buffer layer 117 for lattice matching and to absorb growth defects, a first doped layer 116 (e.g. n- or p-doped), an active layer 114 which can include one or more quantum well layers separated by barrier layers, and a second doped layer 112 (e.g. p- or n-doped), which is doped oppositely than the first doped layer. Additional layers may be included as known, such as electron or hole blocking layers, etc. The structure illustrated in FIG. 4C may correspond that completed at operation 1010 of FIG. 1, prior to removal of the handle substrate 104.

Referring now to FIG. 4D, as previously described with regard to the processing sequence including operation 1020A the reconstituted structure 131 can then be further processed at operation 1020A to form arrays of micro LEDs 150, or at least partially fabricated micro LEDs including micro LED mesa structures 155 in the device layer coupons 106. Such a processing sequence may optionally be performed to condition the reconstituted structure 131 for hybrid bonding to the receiving substrate 202 at operation 1030A of FIG. 1. It is to be appreciated that the micro LEDs 150 and micro LED mesa structures 155 can assume a variety of configurations, and the particular configuration of FIG. 4D and embodiments are not limited to the specific configuration of FIG. 4D. In an exemplary process flow, the handle substrate 104 is first removed, followed by patterning the device layer coupon 106 into one or more micro LED mesa structures 155.

The micro LED mesa structures 155 may be formed using a suitable etching technique (e.g. dry), and hardmask, such as $SiO_2$ or $HfO_x$. An optional sidewall passivation layer 107 may then be formed on mesa sidewalls and the underlying topography (e.g. doped layer 112). For example, sidewall passivation layer 107 may be formed by atomic layer deposition. An exemplary material is $Al_2O_3$, or other suitable dielectric material. Sidewall passivation layer 107 may then be patterned to form openings that will expose the micro LED mesa structures 155 (e.g. doped layer 116).

In an embodiment, well structures 173 are then formed around the micro LED mesa structures 155. In one implementation, a well structure 173 is formed of one or more insulation materials. In an embodiment, the well structure material is a polymer or glass material. The well structure 173 material may additionally include scattering particles dispersed in a matrix (e.g. polymer or glass) to function as a diffuser. In such a structure, the propagation length of light between scattering events may be quite small, giving the light emitted from the micro LEDs opportunity to be extracted. Exemplary diffusers may include a transparent well structure 173 material filled with scattering particles. The transparent well structure 173 material may also be a low index material, high index material, or share a same index of refraction as an overlying layer. In an embodiment, the well structure 173 material is deposited, and patterned to form the well structures. Suitable techniques include but are not limited to spin-on, spray coat, inkjet, slot coat, etc.

Following the formation of the well structures 173, a reflective layer may optionally be deposited and patterned to form reflective layers 175 around the well structures. The reflective layers 175 may be continuous layers that span around and underneath the corresponding micro LED mesa structures 155 and within an opening in the well structure 173 material over doped layer 116. It is to be appreciated that the terms underneath, bottom, over, etc. may be in reference to other features at a particular fabrication stage. For example, the reflective layers 175 may be over the micro LED mesa structures 155 at the fabrication stage in FIG. 4D, and underneath the bottom surfaces of micro LED mesa structures 155 of a micro LED micro-display in a downstream fabrication stage. As shown, the reflective layers 175 span along sidewalls of the well structures 173. The reflective layers 175 may be formed directly on a bottom surface of the micro LED mesa structures 155 in some embodiments. In other embodiments, a contact layer (e.g. ITO) is pre-formed over doped layer 116. In this manner, the reflective layers 175 may be formed directly on the contact layer on the bottom surface of the micro LED mesa structures 155. The reflective layers 175 may be formed of a variety of reflective materials, and may be different depending upon composition of the micro LEDs 150. Accordingly, different reflective layers 175 may be formed over different LED coupons. Exemplary materials include, but are not limited to, aluminum, silver, gold, etc.

The bottom contacts 180 (i.e. bond posts) may then be formed. In an embodiment bottom contacts 180 are formed using a suitable technique such as plating. A fill layer 174 (e.g. planarization layer) may then be blanket deposited, such as with a spin on technique, spray coating, etc. An oxide bonding layer 178, such as a high quality oxide (e.g. silicon oxide) to facilitate hybrid bonding, may optionally be formed over the fill layer 174. The fill layer 174 and/or oxide bonding layer 178 may then be planarized to create a planar surface 186 including planar surface 172 of the fill layer 174 or oxide bonding layer 178, and planar surfaces 182 of the bottom contacts 180. Fill layer 174 may be formed of a suitable insulating material such as a polymer or glass. In an embodiment, in which reflective layers 175 are not formed, the well structure 173 material is selected to have an index of refraction that is higher than an index of refraction of the fill layer 174 to take advantage of reflection by total internal reflection. The order of forming bottom contacts 180 and fill layer 174 and oxide bonding layer 178 may also be reversed, with the fill layer 174 and oxide bonding layer 178 being formed, followed by patterning, formation of the bottom contacts 180 (e.g. by plating), and planarization to create the planar surface 186.

Figure 5B:
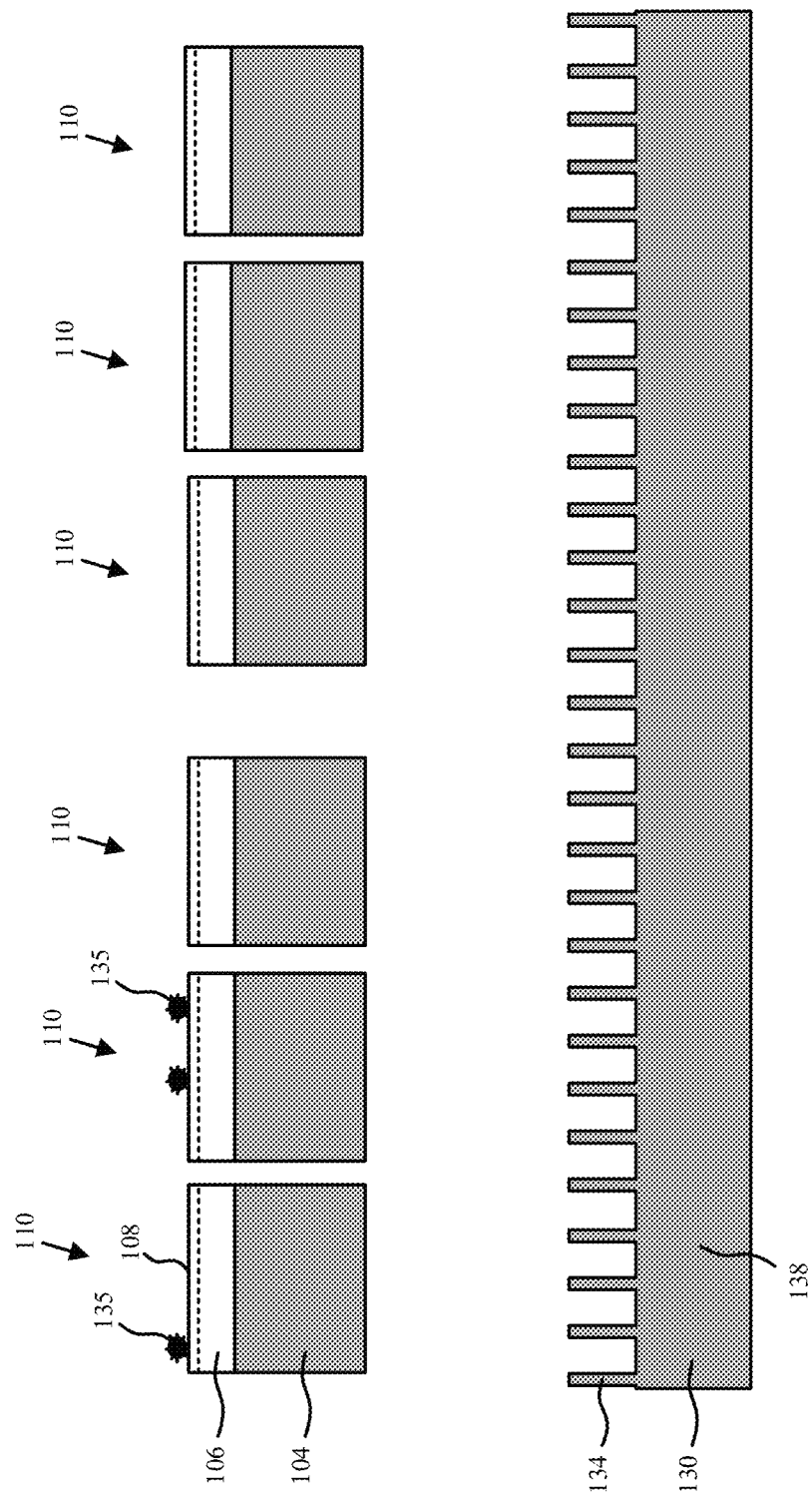
Figure 5C:
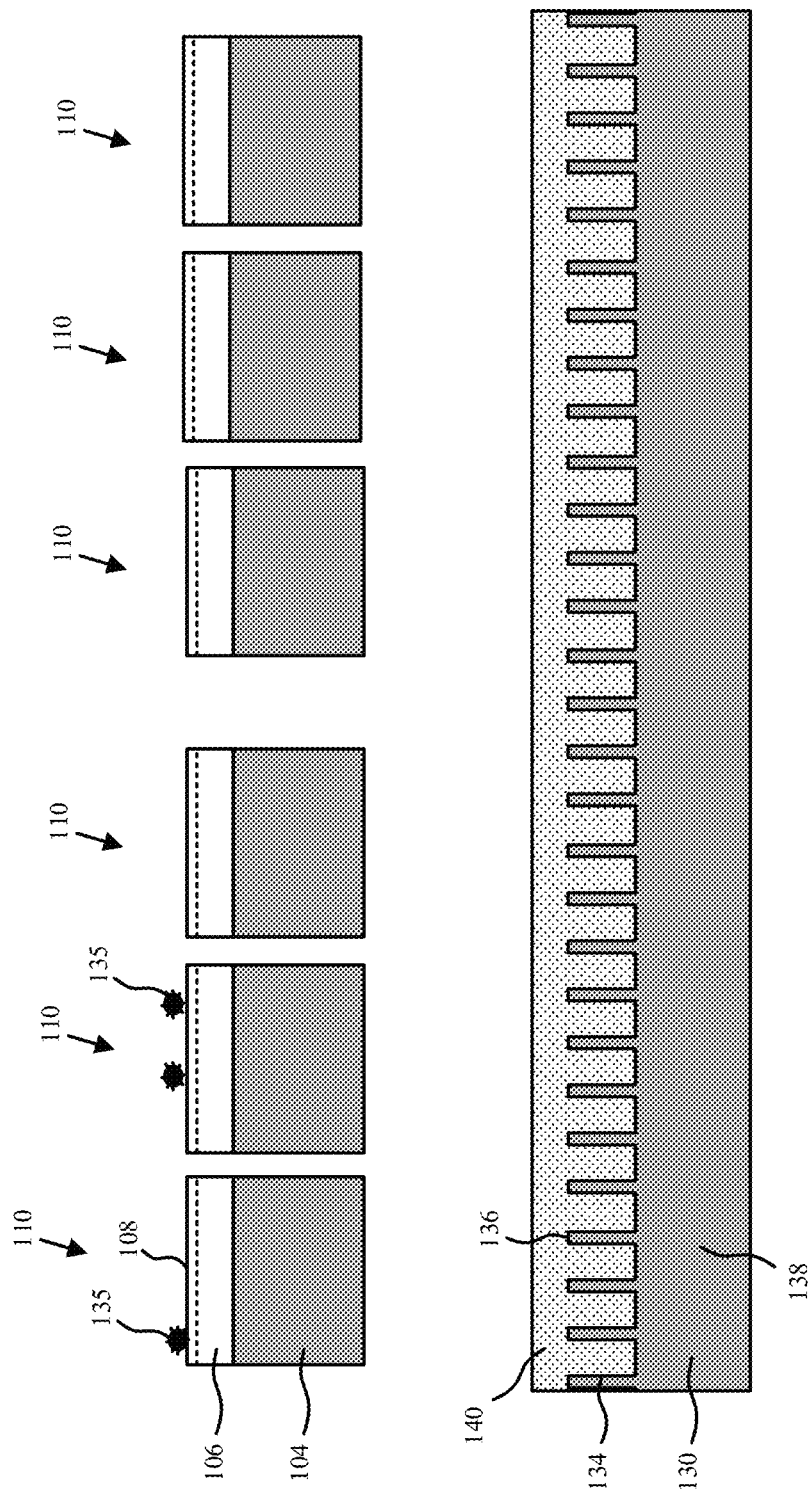

Referring now to FIGS. 5A-5D, schematic cross-sectional side view illustrations are provided for a sequence of forming the reconstituted structure 131 of FIG. 4B in accordance with embodiments. As shown the sequence may begin with multiple starting handle (growth) substrates 104 and epitaxially grown device layers 105. In an embodiment, the epitaxially grown device layers 105 are p-n diode layers. As shown, the device layers in this specific embodiment may include a buffer layer 117 on the handle (growth) substrate 104 to grade the lattice constant between heterogeneous materials and absorb resultant defects, as well as a doped layer 116 (e.g. n-doped), active layer 114, and doped layer 112 (e.g. p-doped) as previously described. Thickness of the epitaxially grown device layers 105 may vary depending upon application. In an embodiment, the buffer layer 117 has a thickness of approximately 5 doped layer 116 has a thickness of approximately 0.1 µm-6 µm, or more specifically 0.1 µm-3 µm, active layer 114 has a thickness less than approximately 0.3 µm and doped layer 112 has a thickness of approximately 0.1 µm-1 µm. In an embodiment, total thickness of the p-n diodes, less the buffer layer 117, is less than 5 µm or more specifically less than 3 µm. In an embodiment, a contact layer such as ITO is formed over the doped layer 112 as previously described. The illustrated stack-up is exemplary, and embodiments are not limited this specific layer sequence. Also shown in FIG. 5A is a carrier substrate 130 including a plurality of hard stop protrusion structures 134 as previously described.

The handle (growth) substrates 104 and epitaxially grown device layers 105 may then be diced into separate coupon stacks 110 as illustrated in FIG. 5B using suitable techniques such as blade sawing, laser dicing, plasma dicing, etc. As shown such techniques may potentially result in residual particles 135 on the front surfaces 108 of the coupon stacks 110. The adhesive layer 140 may then be applied to the carrier substrate 130 in accordance with any of the manners previously described. In the particular embodiment illustrated in FIG. 5C the adhesive layer may completely cover the top surfaces 136 of the hard stop protrusion structures 134, though other configurations are contemplated.

Figure 5D:
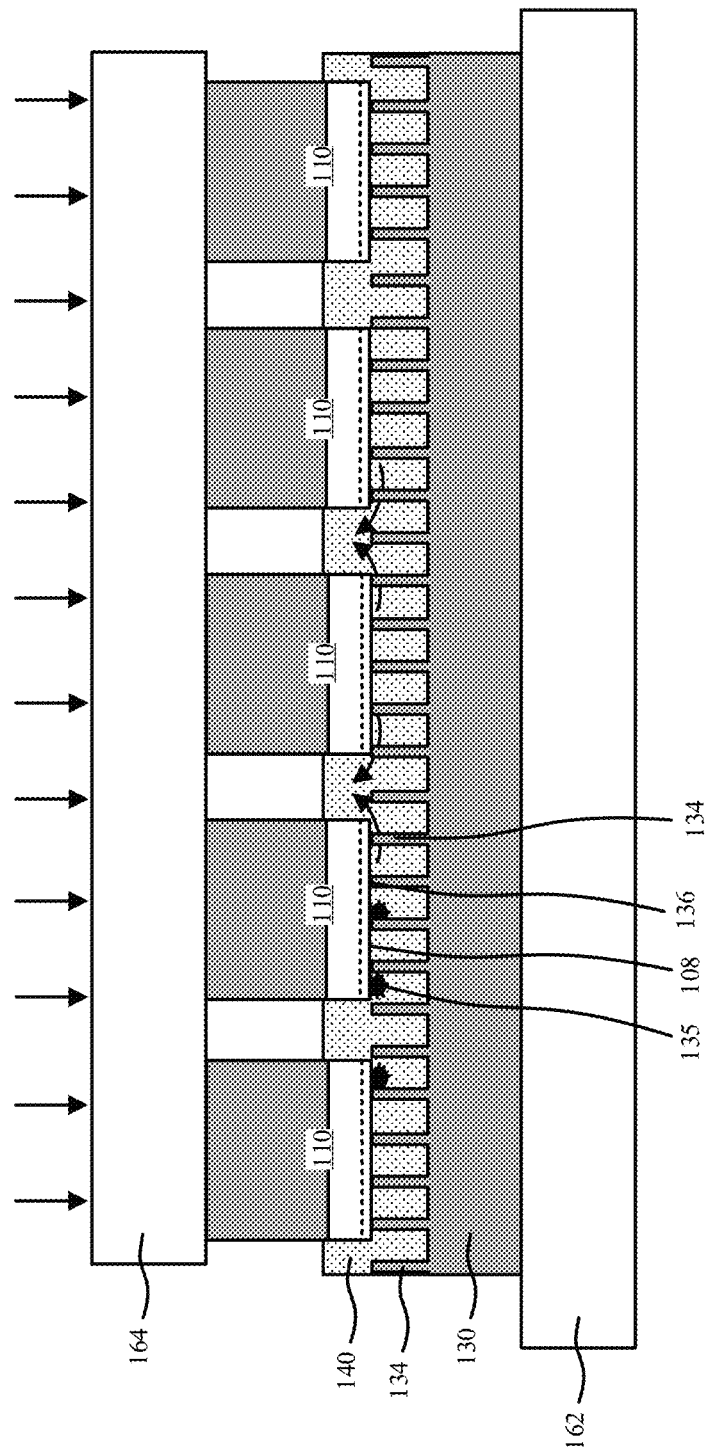

Referring now to FIG. 5D, the plurality of coupon stacks 110 and the carrier substrate 130 can be brought together with front surfaces 108 pressed directly on the top surfaces 136 of the hard stop protrusion structures 134 with pressure applied from a top platen 164 and a bottom platen 162, which may also include or be connected with a heater to provide heat to the adhesive layer 140. As shown, the applied pressure can cause excess adhesive layer 140 material to squeeze out from underneath the coupon stacks 110 to areas between the coupon stacks 110. The top pressing platen 164 may include a flexible surface against the coupon stacks 110 to ensure uniform pressure applied to each coupon stack placed on top of the carrier substrate 130 with protrusion structures. In an embodiment, variation of the vertical position for the front surface 108 of the device layer coupons 106 is less than 50 nm.

The adhesive layer 140 may additionally be cured and hardened by heating up to elevated temperatures with heaters (e.g. connected with bottom platen 162) or by irradiation (laser, UV, e-beam, etc.), while forces press the device layer coupons 106 firmly against the hard stop protrusion structures 134. The handle substrate 104 portions can then be removed, for example using known techniques such as grinding, laser lift-off, etc. This may be accompanied by a back-grinding or polishing operation, resulting in the structure illustrated in FIG. 4B.

The adhesive layer 140 in accordance with embodiments may be formed of a variety of different compositions and applied in different forms. FIG. 6 is a schematic cross-sectional side view illustration of a bonding operation including a colloidal adhesive layer 140 in accordance with embodiments. As shown, the adhesive layer 140 can include distributed microspheres 142 within a matrix of the adhesive layer 140. For example, the microspheres may be rigid spheres that are not comparatively malleable, though certain metals may be used. In an embodiment, a diameter (d) of the microspheres 142 is substantially the same, preferably with Δd<100 nm. In the illustrated embodiment, the microspheres 142 of uniform diameter may provide the same function as the hard stop protrusion structures 134. Thus, an adhesive layer 140 film may be used in place of the hard stop protrusion structures 134, though they can be combined.

Figure 7:
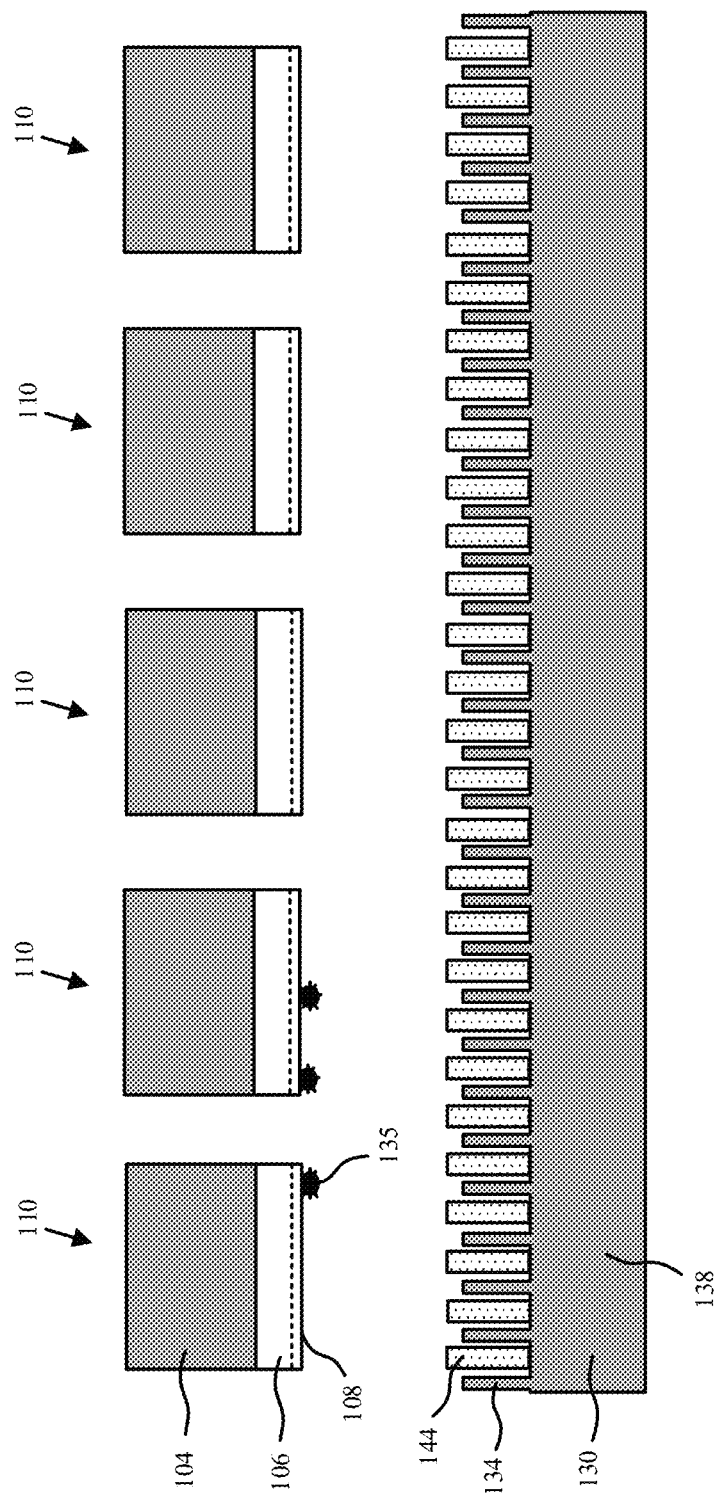
FIG. 7 is a schematic cross-sectional side view illustration of a bonding operation including a patterned adhesive layer on the carrier substrate in accordance with embodiments.

FIG. 7 is a schematic cross-sectional side view illustration of a bonding operation including a patterned adhesive layer 144 on the carrier substrate in accordance with embodiments. Patterned adhesive layer 144 may be compositionally the same as adhesive layer 140 previously described. As shown, the patterned adhesive layer 144 could be a single preform pattern, or a plurality of individual pieces. In other embodiments, a uniform patterned adhesive layer 144 can be deposited and then subsequently patterned. In each circumstance, the patterned arrangement may be utilized to accommodate expansion of the patterned adhesive layer 144 after compression due to pressure applied from top platen 164 and bottom platen 162.

Figure 8:
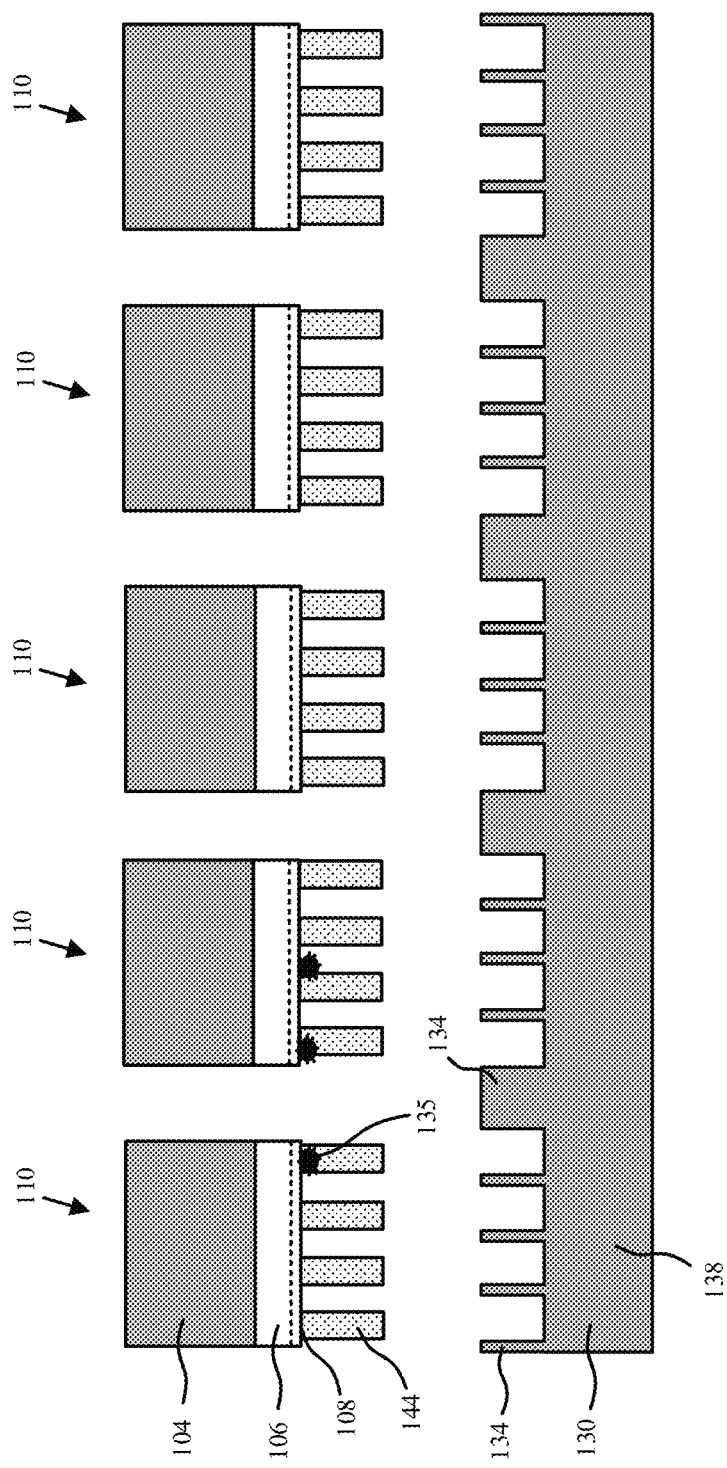
FIG. 8 is a schematic cross-sectional side view illustration of a bonding operation including a patterned adhesive layer on the device layer coupons in accordance with embodiments.

FIG. 8 is a schematic cross-sectional side view illustration of a bonding operation including a patterned adhesive layer 144 on the device layer coupon 106 coupons in accordance with embodiments. As shown, the patterned adhesive layer 144 may be a single preform pattern, or a plurality of individual pieces. In other embodiments, a uniform patterned adhesive layer 144 can be deposited and then subsequently patterned. In an embodiment, the hard stop protrusion structures 134 may have different sizes. For example, some of the hard stop protrusion structures 134 may have smaller widths in regions that will receive (underneath) the device layer coupon 106, while larger widths can be formed between device layer coupons 106 where it may be less essential to provide adherence. The spacing between the hard stop protrusion structures 134 can also be varied. The pitch between hard stop protrusion structures 134 in a regular pattern can be varied. The hard stop protrusion structures 134 can have a regular spacing structure. The hard stop protrusion structures 134 can include one or more sets of protrusion varying in dimension or in pitch, deployed within the same area. The hard stop protrusion structures 134 may adopt a randomized or pseud-random spacing. The hard stop protrusion structures 134 may be absent in some areas on the carrier substrate 130. Thus, embodiments envision a variety of orientations.

Figure 9:
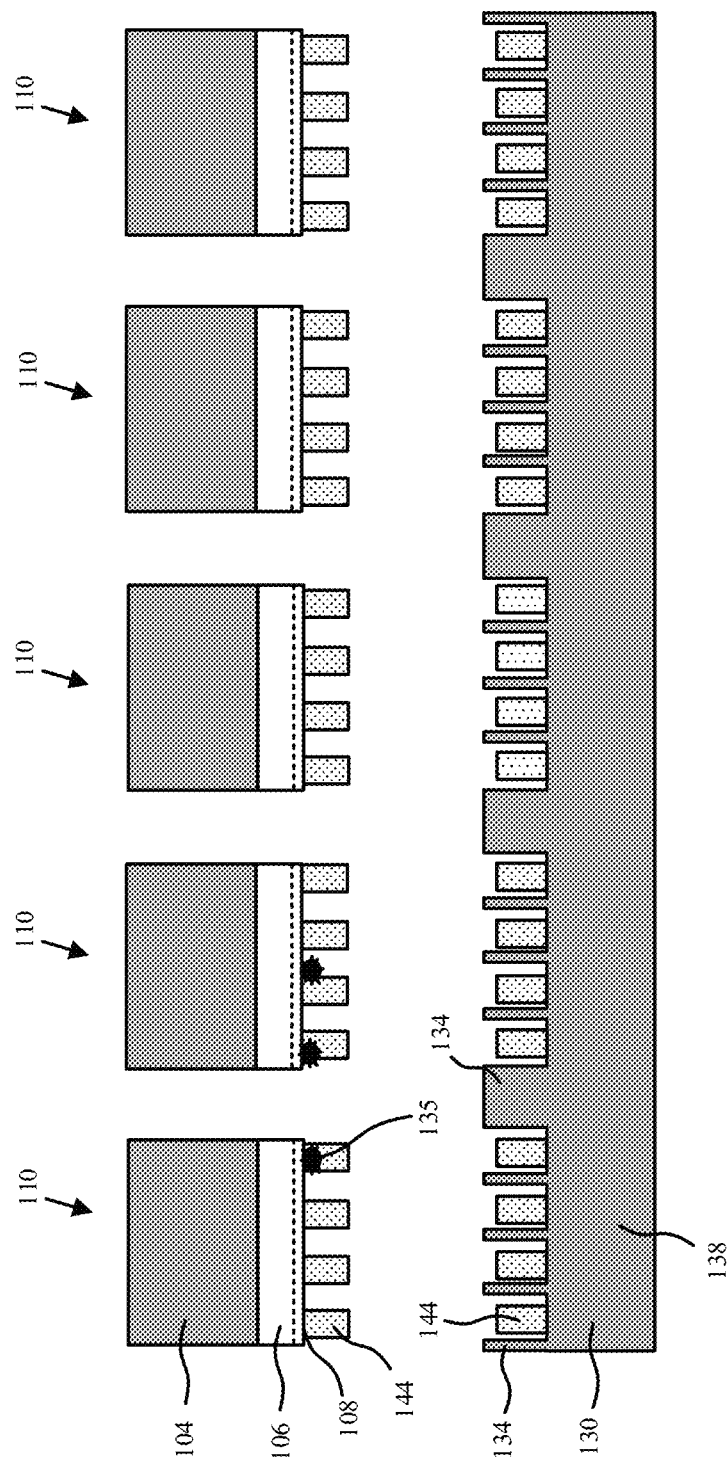
FIG. 9 is a schematic cross-sectional side view illustration of a bonding operation including a patterned adhesive layer on both the carrier substrate and device layer coupons in accordance with embodiments.

FIG. 9 is a schematic cross-sectional side view illustration of a bonding operation including a patterned adhesive layer 144 on both the carrier substrate 130 and device layer coupons 106 in accordance with embodiments. Such a configuration may provide additional clearance between rigid surfaces prior to a high temperature reflow and curing operation.

All of the reconstituted structures 131 described up until this point can then be bonded to a receiving substrate 202 in order to transfer the device layer coupons 106, which may be epitaxial films or patterned epitaxial films for example. Alternatively, the reconstituted structures can be bonded to a second carrier substrate 130A. FIGS. 10A-10F are schematic cross-sectional side view illustrations of fusion bonding the device layer coupons 106 of the reconstituted structure of FIG. 4B to a second carrier substrate 130A in accordance with an embodiment. For example, the processing sequence illustrated in FIGS. 10A-10F correspond to the alternative processing sequence illustrated in FIG. 1 including operations 1015, 1020B, 1030B. It is to be appreciated that the fusion bonding sequence is exemplary, and embodiments envision various modifications.

Figure 10A:
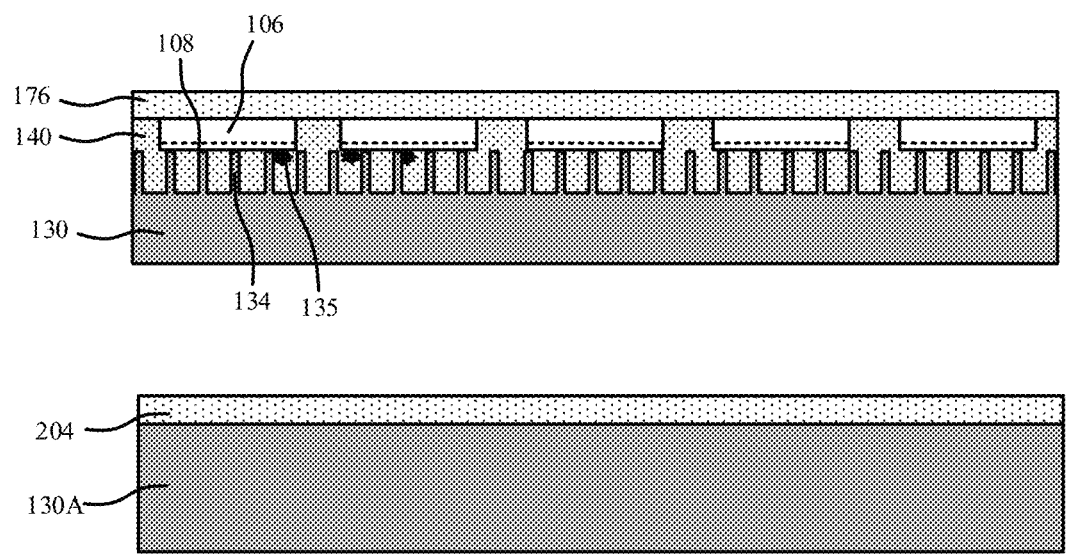
FIGS. 10A-10E are schematic cross-sectional side view illustrations of fusion bonding the device layer coupons of the reconstituted structure of FIG. 4B to a receiving substrate in accordance with an embodiment.
Figure 10B:
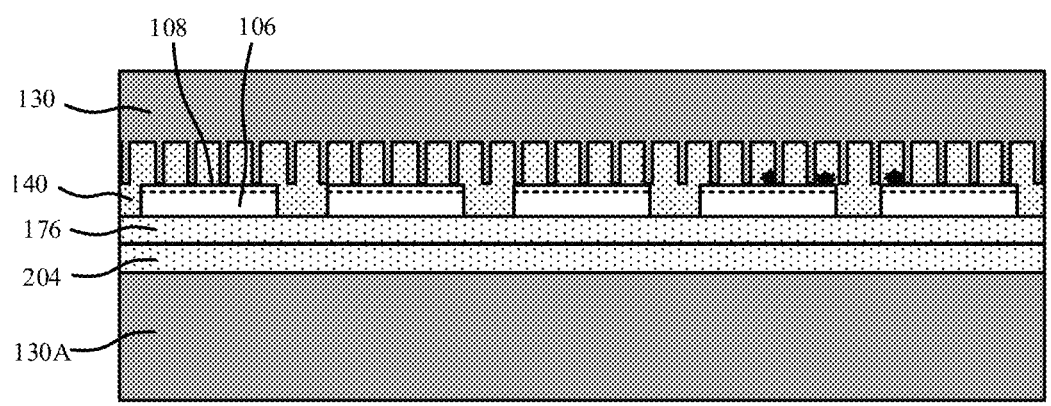

Referring now to FIG. 10A a dielectric layer 176 (e.g. fusion bonding layer) is optionally formed over the reconstituted structure 131 of exemplary FIG. 4B. As such, the dielectric layer 176 (e.g. $SiO_2$) can be a global layer formed over the carrier substrate 130. It is not required to form such a dielectric layer 176, and instead dielectric layer 176 could be formed as part of the device layer coupons 106. Similarly, a dielectric layer 204 (e.g. fusion bonding layer) can be formed over the second carrier substrate 130A. For example, the dielectric layer 204 (e.g. $SiO_2$) may be planarized to prepare for W2W bonding. It is to be appreciated that the carrier substrate 130 including hard stop protrusion structures 134 is exemplary, and other rigid mechanical spacers could be implemented such as the microspheres 142 distributed within a matrix of the adhesive layer 140 of FIG. 6. The reconstituted structure 131 may then be bonded to the second carrier substrate 130A as shown in FIG. 10B. In the exemplary embodiment illustrated dielectric layers 176, 204 are fusion bonded together. In an embodiment, the bonding operation of FIG. 10B is a W2W bonding operation between two wafers.

Figure 10C:
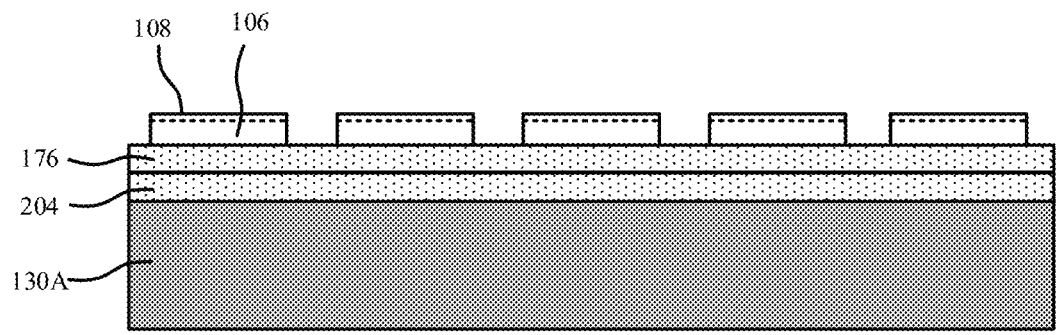
Figure 10D:
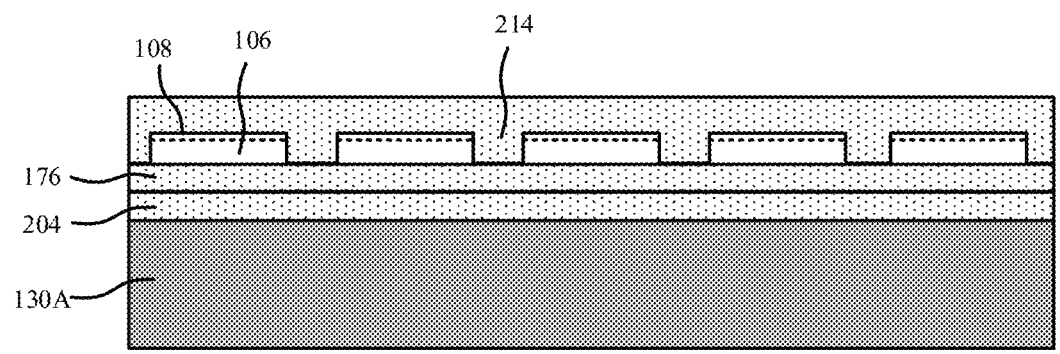
Figure 10E:
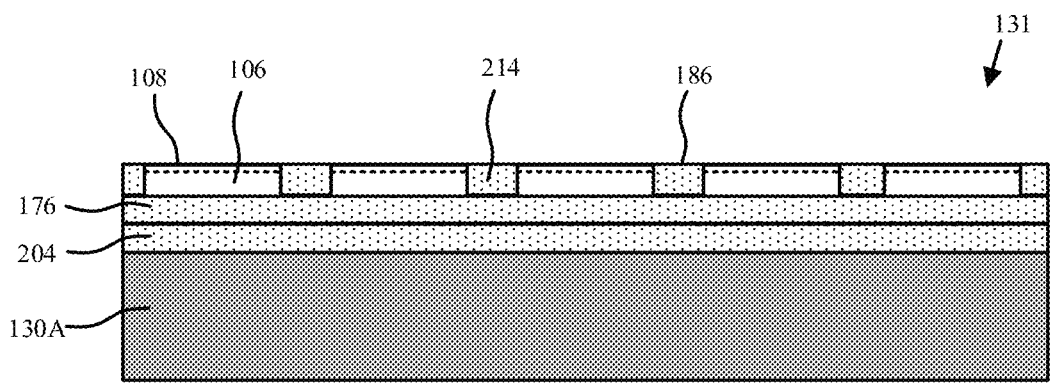

Referring to FIG. 10C, the carrier substrate 130 and optionally at least a portion of the adhesive layer 140 may be removed. At this stage relative orientation of the doped layers 112, 116 is inverted. As shown, the front surface 108 of the device layer coupons 106 are now facing up. A gap fill layer 214 may then be formed as shown in FIG. 10D on the dielectric layer 176 and between the plurality of device layer coupons 106. The gap fill layer 214 may be any suitable insulating material, formed by various deposition methods in order to provide gap filling function between adjacent device layer coupons 106. The gap fill layer 214 can also be used for subsequent fusion/hybrid bonding. For example, the gap fill layer 214 may be $SiO_2$. The reconstituted structure 131 may then be planarized, or thickness otherwise reduced as shown in FIG. 10E to expose the front surfaces 108 of the device layer coupons 106. As shown, a planar surface 186 may be formed across the gap fill layer 214 and the plurality of device layer coupons 106.

Figure 10F:
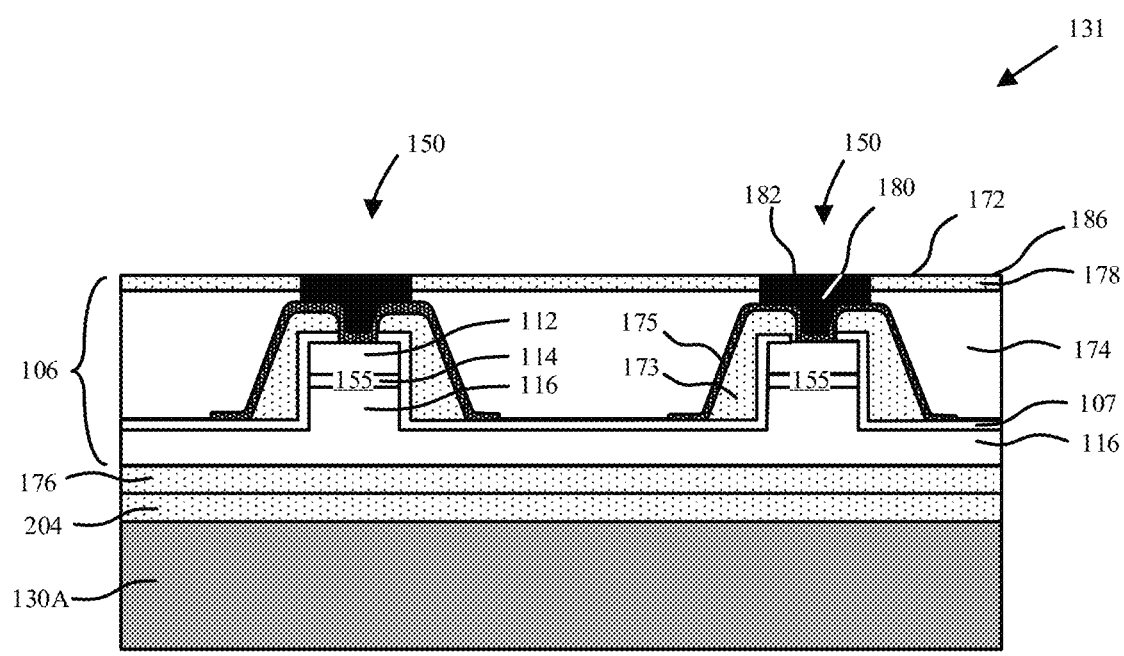
FIG. 10F is a close up schematic cross-sectional side view illustration of a plurality of micro LEDs formed in an epitaxial device layer coupon of FIG. 10E in accordance with an embodiment.

Referring now to FIG. 10F a close up schematic cross-sectional side view illustration is provided of a plurality of micro LEDs 150 formed in an epitaxial device layer coupon of FIG. 10E in accordance with an embodiment. The particular structure illustrated in FIG. 10F is substantially similar to that illustrated and previously described with regard to FIG. 4D. Accordingly, in interest of clarity and conciseness similarities are not repeated. A notable difference exists in the formation of the micro LEDs 150 over a second carrier substrate 130A which has been fusion bonded. Additionally, the adhesive layer material has been removed during prior processing. Additionally, orientation of the LED mesa structures 155 is inverted, with bottom contacts 180 formed on doped layer 112 as opposed to doped layer 116.

Figure 11:
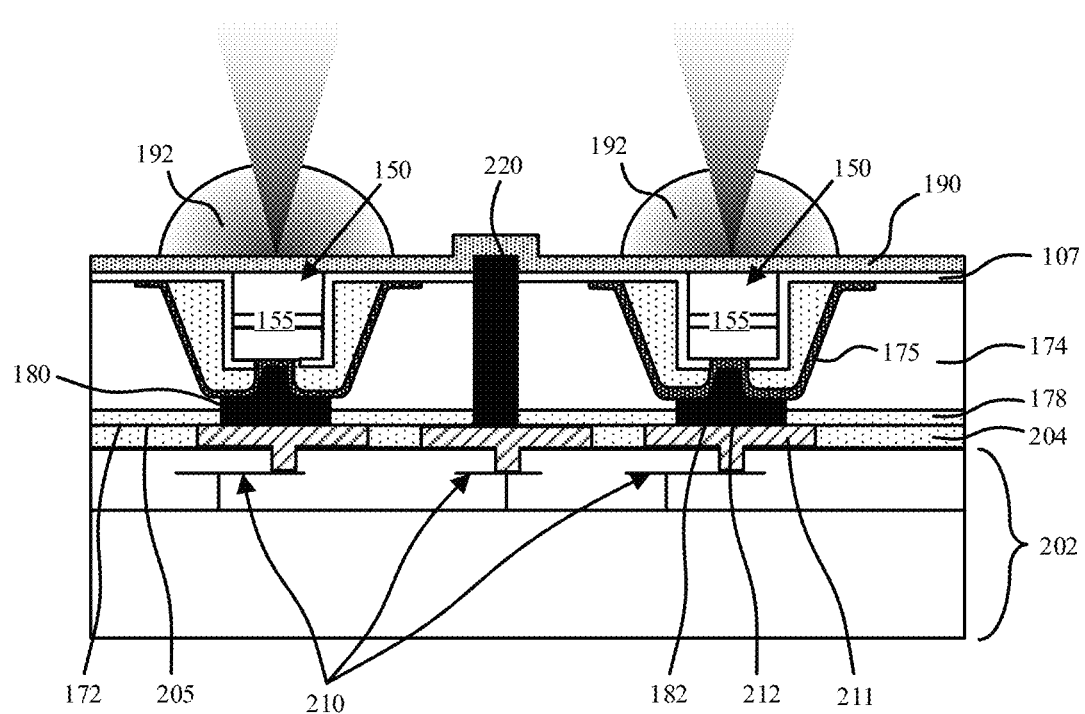
FIG. 11 is a close up schematic cross-sectional side view illustration of hybrid bonding the micro LED device layer coupon of the reconstituted structure of FIG. 4D or FIG. 10F to a receiving substrate in accordance with an embodiment.

FIG. 11 is a close up schematic cross-sectional side view illustration of hybrid bonding the micro LED device layer coupon 106 of the reconstituted structure 131 of FIG. 4D or FIG. 10F to a receiving substrate 202 in accordance with an embodiment, with the inclusion of metal-metal bonding. In particular, the structure illustrated in FIG. 11 may be obtained after operations 1030A, 1030B of FIG. 1, as well as additional integration. As shown, bottom contacts 180 are bonded to contact pads 211 (e.g. electrode pads, driver pads) on a receiving (e.g. display) substrate 202. Bonding may be achieved using a variety of methods, including W2W.

In a specific embodiment, a hybrid bonding technique is utilized in which a bottom surface 182 of the bottom contacts 180 is bonded to a top surface 212 of the contact pads 211 with a metal-metal bond, and a bottom surface 172 of the fill layer 174 or oxide bonding layer 178 is bonded to a top surface 205 of the receiving (display) substrate 202 with an oxide-oxide bond. For example, top surface 205 may also be a top surface of an oxide bonding layer 204, such as a high quality oxide (e.g. silicon oxide), of the receiving substrate. In accordance with embodiments, hybrid bonding may be facilitated by bonding of planarized surfaces. The receiving substrate 202 may be a variety of substrates including polymer, glass, silicon, etc. and may be rigid or flexible. In an embodiment, the receiving substrate 202 includes a silicon substrate. For example, the receiving substrate 202 may be a complementary metal-oxide-semiconductor (CMOS) wafer including circuitry 210 to address the micro LEDs 150 bonded to the contact pads 211.

In the embodiment illustrated in FIG. 11, the carrier substrate 130 or second carrier substrate 130A have been removed along with corresponding adhesive layers 140 or fusion bonding dielectric layers 176, 204, which can be followed by thinning of the device layer coupon 106, or more particularly doped layer 112 or doped layer 116 to form separate, discrete micro LEDs 150. Individual contacts (e.g. n-contacts, though could be p-contacts) may optionally be formed on the micro LED mesa structures 155 of the micro LEDs 150. A top electrode layer 190 is then formed over the micro LEDs 150. The top electrode layer 190 may be a common layer shared by multiple micro LEDs 150, across multiple pixels in some embodiments. The top electrode layer 190 may additionally be formed on a contact terminal 220. For example, the contact terminal may connect to ground or low voltage (Vss) line. As shown, the contact terminal 220 may be in the form of a plug or via extending through the fill layer 174. In an embodiment, contact terminal 220 is on a corresponding contact pad 211 of the receiving substrate 202. The contact terminal 220 may be formed at a variety of stages. For example, the contact terminal 220 may be formed along with the bottom contact pads 211. In such an embodiment, the contact terminal 220 may be bonded to the contact pad 211 with a metal-metal bond during a hybrid bonding technique. The contact terminal 220 may optionally be formed after removing the carrier substrate. This may be followed by further wafer level processing including CMP, RDL and/or optical structure formation, such as color filter array, micro lens array, etc. In the exemplary embodiment illustrated in FIG. 11 a micro lens 192 can be formed over each micro LED 150. For example, the micro lens 192 may be formed of a transparent high-index material (e.g. n=1.3-2.4), and may be formed in a variety of shapes including half-ball.

In utilizing the various aspects of the embodiments, it would become apparent to one skilled in the art that combinations or variations of the above embodiments are possible for forming micro LED array based micro-displays using wafer reconstitution and die-to-wafer transfer of device layers with controlled vertical position. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A method of forming a reconstituted structure comprising:
bonding a plurality of device layer coupons on a carrier substrate with an adhesive layer, wherein each of the plurality of device layer coupons is connected with corresponding a handle substrate, wherein a plurality of rigid mechanical spacers control a distance between front surfaces of the plurality of device layer coupons and a bulk layer of the carrier substrate, wherein the adhesive layer at least partially fills spaces between the plurality of rigid mechanical spacers and the adhesive layer at least partially fills spaces between the plurality of device layer coupons;
hardening the adhesive layer;
removing each handle substrate; and
back-grinding to form a surface with the plurality of device layer coupons and the adhesive layer.

2. The method of claim 1, further comprising forming the adhesive layer over the bulk layer of the carrier substrate, wherein the plurality of rigid mechanical spacers is a plurality of hard stop protrusion structures extending from the bulk layer.

3. The method of claim 2, wherein forming the adhesive layer comprises forming a patterned adhesive layer covering the bulk layer of the carrier substrate except in a vicinity of the plurality of hard stop protrusion structures so that the plurality of hard stop protrusion structures is isolated from the adhesive layer.

4. The method of claim 1, further comprising forming the adhesive layer over the bulk layer of the carrier substrate, wherein the plurality of rigid mechanical spacers is a plurality of microspheres dispersed in the adhesive layer.

5. The method of claim 1, wherein forming the adhesive layer comprises forming a continuous adhesive layer over the carrier substrate.

6. The method of claim 1, wherein an average spacing between adjacent hard stop protrusion structures is half or less than an average width of the device layer coupons.

7. The method of claim 1, wherein top surfaces of the plurality of rigid mechanical spacers form a plane with an unevenness less than 200 nm.

8. The method of claim 1, further comprising patterning a plurality of micro light emitting diode (LED) mesa structures into each device layer coupon while the plurality of device layer coupons is bonded to the carrier substrate.

9. The method of claim 8, further comprising:
hybrid bonding the plurality of device layer coupons to a receiving substrate;
wherein the receiving substrate includes complementary metal oxide semiconductor (CMOS) driver circuitry, and the plurality of micro LED mesa structures is bonded to contact pads connected with CMOS driver circuitry.

10. The method of claim 1, further comprising:
bonding the plurality of device layer coupons to a second carrier substrate; and
removing the carrier substrate.

11. The method of claim 10, further comprising patterning a plurality of micro light emitting diode (LED) mesa structures into each device layer coupon after removing the carrier substrate.

12. The method of claim 11, further comprising:
bonding the plurality of device layer coupons to a receiving substrate;
wherein the receiving substrate includes complementary metal oxide semiconductor (CMOS) driver circuitry, and the plurality of micro LED mesa structures is bonded to contact pads connected with CMOS driver circuitry.

13. The method of claim 12, wherein bonding the plurality of device layer coupons to the second carrier substrate comprises fusion bonding, and bonding the plurality of device layer coupons to the receiving substrate comprises hybrid bonding.

* * * * *